United States Patent
Stowell et al.

(10) Patent No.: US 9,018,110 B2
(45) Date of Patent: Apr. 28, 2015

(54) APPARATUS AND METHODS FOR MICROWAVE PROCESSING OF SEMICONDUCTOR SUBSTRATES

(75) Inventors: Michael W. Stowell, Loveland, CO (US); Majeed A. Foad, Sunnyvale, CA (US); Ralf Hofmann, Soquel, CA (US); Wolfgang R. Aderhold, Cupertino, CA (US); Stephen Moffatt, St. Brelade (JE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/112,012

(22) PCT Filed: Mar. 29, 2012

(86) PCT No.: PCT/US2012/031140
§ 371 (c)(1),
(2), (4) Date: Oct. 15, 2013

(87) PCT Pub. No.: WO2012/148621
PCT Pub. Date: Nov. 1, 2012

(65) Prior Publication Data
US 2014/0038431 A1 Feb. 6, 2014

Related U.S. Application Data

(60) Provisional application No. 61/478,833, filed on Apr. 25, 2011.

(51) Int. Cl.
*H01L 23/66* (2006.01)
*H01L 21/263* (2006.01)
*H01L 21/324* (2006.01)
(Continued)

(52) U.S. Cl.
CPC ............ *H01L 21/263* (2013.01); *H01L 21/324* (2013.01); *H01L 21/67115* (2013.01); *H05B 6/702* (2013.01); *H05B 6/708* (2013.01)

(58) Field of Classification Search
CPC .................. H04B 5/0018; H01L 2924/0002; H01L 2924/00; H01L 2223/6677; H01L 23/66
See application file for complete search history.

(56) References Cited

U.S. PATENT DOCUMENTS

| | | | |
|---|---|---|---|
| 6,509,873 B1 * | 1/2003 | Nalbandian et al. | 343/700 MS |
| 7,245,269 B2 * | 7/2007 | Sievenpiper et al. | 343/909 |
| 8,421,698 B2 * | 4/2013 | Neto et al. | 343/771 |

(Continued)

OTHER PUBLICATIONS

International Search Report and Written Opinion, PCT/US2012/031140, Oct. 23, 2012.

*Primary Examiner* — Evan Pert
*Assistant Examiner* — Gustavo Ramallo
(74) *Attorney, Agent, or Firm* — Patterson & Sheridan, LLP

(57) ABSTRACT

Methods and apparatus for radiation processing of semiconductor substrates using microwave or millimeter wave energy are provided. The microwave or millimeter wave energy may have a frequency between about 600 MHz and about 1 THz. Alternating current from a magnetron is coupled to a leaky microwave emitter that has an inner conductor and an outer conductor, the outer conductor having openings with a dimension smaller than a wavelength of the emitted radiation. The inner and outer conductors are separated by an insulating material. Interference patterns produced by the microwave emissions may be uniformized by phase modulating the power to the emitter and/or by frequency modulating the frequency of the power itself. Power from a single generator may be divided to two or more emitters by a power divider.

18 Claims, 17 Drawing Sheets

(51) Int. Cl.
 *H01L 21/67* (2006.01)
 *H05B 6/70* (2006.01)

(56) References Cited

U.S. PATENT DOCUMENTS

| | | | |
|---|---|---|---|
| 8,568,571 B2* | 10/2013 | Kwak et al. | 204/192.12 |
| 8,681,050 B2* | 3/2014 | Thornwall et al. | 343/700 MS |
| 2006/0228871 A1* | 10/2006 | Wajda et al. | 438/478 |
| 2008/0309239 A1* | 12/2008 | Kasai et al. | 315/39.51 |
| 2009/0238998 A1* | 9/2009 | Stowell et al. | 427/575 |
| 2009/0277778 A1* | 11/2009 | Stowell et al. | 204/192.12 |
| 2010/0078320 A1* | 4/2010 | Stowell | 204/298.07 |
| 2011/0127156 A1* | 6/2011 | Foad et al. | 204/192.12 |

* cited by examiner

APPARATUS AND METHODS FOR MICROWAVE PROCESSING OF SEMICONDUCTOR SUBSTRATES

FIELD

Technology described herein relates to manufacture of semiconductor devices. More specifically, apparatus and methods for annealing semiconductor devices are described.

BACKGROUND

Annealing and dopant activation are two processes commonly performed on semiconductor substrates in fabricating logic devices, memory devices, photoemission devices, energy devices, and the like. A semiconductor substrate, such as silicon, germanium, a silicon germanium alloy, or a compound semiconductor such as any of the group III/V, group II/VI, or CIGS semiconductor compounds known to the art, is doped with a selected dopant, or multiple dopants. The dopants are implanted or deposited and diffused into the semiconductor matrix. Upon implantation and/or diffusion, the concentration of dopants as a function of depth within the substrate assumes a certain profile, and the implantation/diffusion process typically disrupts the crystal structure of the semiconductor matrix. The dopant concentration profile is usually not optimal for device performance, and the disrupted, or in some cases fully amorphized, crystal structure increases resistivity of the substrate.

To adjust the concentration profile and repair the crystal structure, the substrate is annealed, during which process the dopants are encouraged to diffuse into a desired concentration profile and attach to the crystal matrix. The annealing process also moves the semiconductor atoms back into a matrix position, repairing the crystal structure of the substrate. The dopants are activated by their inclusion in the crystal matrix, enhancing the electrical properties of the substrate. Reduction of defects in the crystal matrix improves conductivity of the material.

The diffusion process is difficult to control. While dopants are diffusing into a more desirable profile, some dopants are diffusing outside the target doping zone, leading to undesirable and/or unstable properties such as current leakage and voltage drift. As device geometries shrink according to Moore's Law, the size of target doping zones becomes accordingly smaller, and controlling the diffusion of dopants during an anneal process becomes more challenging. Methods of using visible and IR radiation for fast annealing are currently used to achieve very fast anneals, reducing the background thermal energy propagating through the material and driving unwanted diffusion, but such methods are expected to reach an effective limit at technology nodes below about 22 nm.

Use of microwave energy for annealing has been demonstrated (see Splinter, et al., U.S. Pat. No. 4,303,455), but microwave annealing has never achieved large-scale commercial acceptance. One challenging aspect of microwave annealing, and annealing in general, is achieving uniform results. Achieving a uniform laser energy field for laser annealing has been the topic of considerable scholarship for decades, but methods and apparatus for uniform annealing of semiconductor substrates using microwaves are still elusive. Microwave annealing offers the possibility of non-thermal, or low thermal budget, radiative processing of substrates—that is, processing substrates using electromagnetic radiation that minimizes thermal energy propagating through the substrate, thus minimizing unwanted diffusion. Methods and apparatus are still needed, however, for exposing substrates to highly uniform microwave energy fields.

SUMMARY

Embodiments disclosed herein provide methods and apparatus for annealing of semiconductor substrates using microwave or millimeter wave energy. The microwave or millimeter wave energy may have a frequency between about 600 MHz and about 1 THz. Alternating current from a magnetron is coupled to a leaky microwave emitter that has an inner conductor and an outer conductor, the outer conductor having openings with a dimension smaller than a wavelength of the emitted radiation. The inner and outer conductors are separated by an insulating material. Interference patterns produced by the microwave emissions may be uniformized by phase modulating the power to the emitter and/or by frequency modulating the frequency of the power itself. Power from a single generator may be divided to two or more emitters by a power divider.

A leaky microwave source generally comprises an inner conductor and an outer conductor separated by an insulating material. The emitter may be a coaxial cable or tube that generates a line source or quasi-line source of microwave energy, or a two dimensional source that generates a field of microwave energy. The outer conductor has openings formed therein to allow radiation to emerge from the area between the inner and outer conductors. The openings typically have a dimension smaller than a wavelength of the emitted radiation. The openings may be sized and shaped to provide radiation having a defined propagation field and intensity pattern.

Microwave energy emitters may be coupled with emitters of thermal energy for combined thermal/microwave annealing. Thermal energy may be used to elevate a temperature of a substrate to lower the energy barrier for rearrangement of amorphous material, defects in crystalline material, and/or dopants in an amorphous or crystalline material. The thermal energy may be less than a threshold level that would activate dopant diffusion. A pulsed or continuous microwave field applied to the substrate will selectively couple with crystal defects and interstitials to anneal and/or recrystallize the substrate surface. Microwaves will penetrate the surface of a conductive or semiconductive substrate up to the skin depth.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
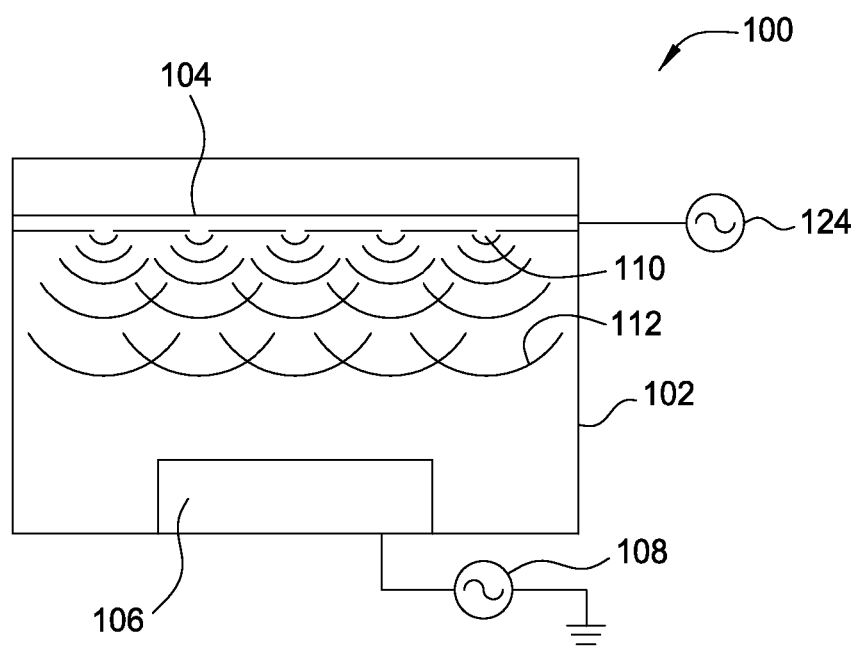
FIG. 1A is a cross-sectional view of a radiation processing apparatus according to one embodiment.

FIG. 1A is a cross-sectional view of an annealing apparatus 100 according to one embodiment. A chamber 102 encloses a substrate support 106 and a microwave source 104. The chamber 102 is generally electrically conductive, or has an electrically conductive component to confine the microwaves to the chamber enclosure. Stainless steel or aluminum is commonly used for conductive chamber walls.

The microwave source 104 is linear, and may be a coaxial cable comprising an inner conductor and an outer conductor. The inner and outer conductors may be any electrically conducting material, such as copper, gold, silver, combinations thereof, or other conductors. In one embodiment, the inner conductor is a copper wire and the outer conductor is a braid of gold coated tungsten wire. Because current flow in the outer conductor is along the skin of the outer conductor, the gold coating provides conductivity while the tungsten wire provides a low cost foundation for the conductive gold coating. The coaxial cable is connected to a magnetron 124 for generating microwave frequency power through the coaxial cable.

Frequencies that may be used for annealing range from about 300 MHz to about 1 THz, encompassing microwave and millimeter wave frequencies, depending on the substrate being annealed. Microwave and millimeter wave radiation is thought to be especially suited to annealing of semiconductor substrates because defects in the crystal structure of a semiconductor material have an electric dipole that has energy modes corresponding to such radiation. By contrast, the electrons participating in covalent bonds between semiconductor atoms in the crystal matrix respond to radiation in the UV, visible, and infrared spectra. Microwave and millimeter wave radiation is thought to couple preferentially with the defects in the matrix without introducing substantial thermal energy, transferring momentum into the defects to facilitate removal of the defects at low temperatures. In some embodiments, a standard 2.45 GHz microwave magnetron may be used to generate microwaves in the coaxial cable. In other embodiments, generators operating at 915 MHz, 5.8 GHz, and 6.0 GHz may be beneficially used.

In a standard coaxial cable, alternating current in the inner conductor generates microwaves that radiate outward from the inner conductor. The outer conductor, carrying current opposite that of the inner conductor, acts as a waveguide for the microwaves, confining them to the immediate vicinity of the cable. Energy from the microwaves extends outside the physical boundary of the cable a short distance, and may give rise to a plasma in the atmosphere immediately adjacent to the cable.

Figure 1B:
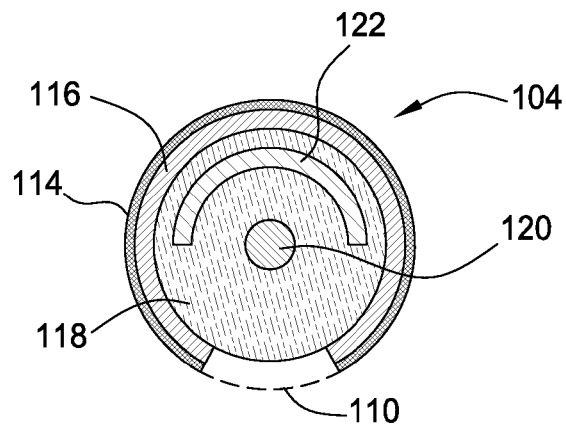
FIG. 1B is a cross-sectional view of a microwave line source according to another embodiment.

In the microwave source 104, openings 110 are provided in the outer conductor to allow microwaves 112 generated by the inner conductor to radiate, or leak, out of the cable, rather than being confined to the cable. The microwaves radiate from each opening in a spherical pattern. FIG. 1B is a cross-sectional view of the microwave source 104. A first conductor 120 and a second conductor 116 are separated by an insulating material 118, which may be a dense solid, a porous solid, or a dielectric fluid such as a gas. The first and second conductors may also be separated by a vacuum in some embodiments. The microwave source 104 may have an insulating coating 114, if desired. The coating 114 may also be a protective coating to protect the conductors of the microwave source 104 from any material outgassing from a substrate, or from process gases around the microwave source 104. The openings 110 may also be covered by the coating 114, if desired, although the embodiment of FIG. 1B does not show the coating 114 extending over the opening 110.

Openings such as the openings 110 are typically aligned along one side of the microwave source 104 facing the substrate support 106 to project microwaves toward the substrate support 106. The openings may have an axial dimension oriented along a major axis of the microwave source 104, and a transverse dimension perpendicular to the axial dimension. The axial dimension is typically much smaller than a wavelength of microwave radiation being generated by the microwave source 104, for example less than half the wavelength. The transverse dimension may be any desired dimension, depending on the radiation pattern desired. A larger transverse dimension will allow microwaves to radiate over a broader area with a relatively flat intensity profile, while a narrow transverse dimension will radiate microwaves narrowly, with an intensity profile that declines in the transverse direction according to a substantially Gaussian distribution. The axial and transverse dimensions of the openings may be the same or different. The openings may be round, square, rectangular, or extended with rounded or rectangular ends.

FIG. 1B is a cross-sectional view of the microwave source of FIG. 1A. An inner conductor 120 is surrounded by an insulating material 118. The inner conductor may be any conductive material useful for transmitting substantial current, such as copper, aluminum, silver, or gold. A composite material may be used in which a high conductivity outer skin, eg gold or copper, is applied to a lower conductivity core, eg nickel, to form the inner conductor 120. The outer skin may have a thickness of at least about 1 µm, for example between about 1 µm and about 100 µm, to provide sufficient cross-section for most current density to flow through the high conductivity material at the outer skin, thereby at least partially counteracting the resistivity of the skin effect at high frequencies.

The insulating material 118 may be a dielectric material, such as ceramic, plastic, or glass, or a gas such as air, nitrogen, or a noble gas, or a vacuum. In one embodiment, the dielectric material may be an alumina tube. It should be noted that, although the insulating material 118 is shown in FIG. 1B contacting the inner conductor 120, there need be no contact between the two. Thus, the insulating material 118 may be composite, for example a solid, such as alumina, and a gas, such as air, nitrogen, or a noble gas. In some embodiments, an insulating fluid, such as a hydrocarbon fluid, a wax, or an oil, may also be used as the insulating material or with another solid insulating material.

An outer conductor 116 is disposed around the insulating material 118. The outer conductor may be a composite conductor having a highly conductive outer skin with a less conductive core, similar to the inner conductor 120. In one embodiment a titanium tube coated with a layer of gold between about 1 µm and about 100 µm, such as about 20 µm, may be used as an outer conductor.

The openings 110 formed in the outer conductor 116 provide a window for microwave radiation propagating through the insulating material between the inner and outer conductors 120 and 116 to propagate outward. The outer conductor 116 functions as a wave guide for electromagnetic radiation generated by alternating current moving through the inner conductor 120. Radiation reflects between the conductive surfaces of the inner and outer conductors 120 and 116, giving rise to a standing wave within the insulating material 118. At the opening 110, the radiation emerges into the processing environment. The opening 110 generally has a width smaller than a wavelength of the radiation in one or more directions to produce radiation that behaves as a point source or line source in at least one direction. In some embodiments, all dimensions of each opening are much smaller than the wavelength, such that each opening simulates a point source emitter.

A coating 114 typically surrounds the outer conductor 116 for protection from the environment. The coating 114 may also have an opening, as shown in the embodiment of FIG. 1B, or may cover the opening 110, provided the coating 114 is not also substantially conductive. For non-reactive processing environments, the coating 114 may be an insulating material relatively impervious to oxygen and moisture, such as a polymer material. For reactive environments, the coating is generally selected to withstand the processing environment substantially undegraded. For example, when a microwave source such as the microwave source 104 is included in a plasma doping chamber, the coating 114 may be formed from a material such as silicon or carbon that, while changed by exposure to ions in the plasma doping environment, remains structurally sound and relatively non-conductive. For other reactive environments desirous of including microwave sources, such as etching or deposition environments, the coating is selected to be substantially non-reactive. In a deposition environment, the coating is selected to be substantially non-reactive to a cleaning chemistry that may be used periodically within the chamber.

Figure 2:
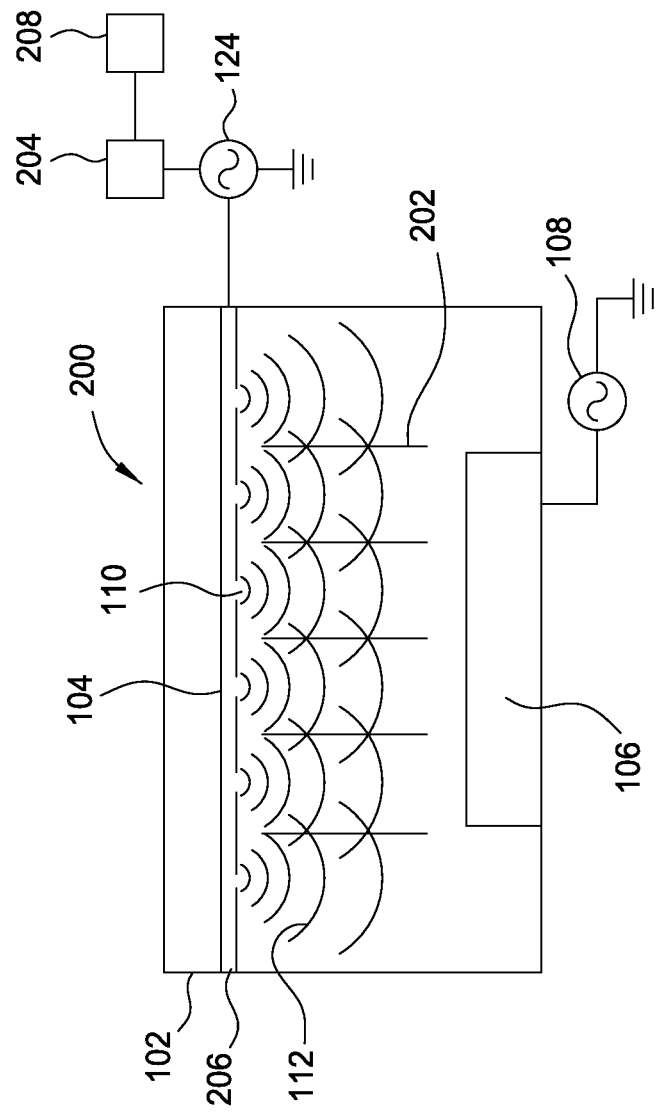
FIG. 2 is a schematic view of a radiation processing chamber according to another embodiment.

FIG. 2 is a cross-sectional view of a radiation processing chamber 200 according to another embodiment. Identical elements to those in FIG. 1A are numbered identically. The microwaves 112 radiating from the openings 110 in the leaky coaxial microwave source 104 create an interference pattern 202 comprising nodes and antinodes of varying intensity, as is well known. If a substrate is treated with the static interference pattern of the radiation, results of the treatment will be non-uniform across the substrate due to the non-uniform intensity of the radiation. To improve the uniformity of the radiation used for treating the substrate, the projection of the interference pattern 202 on the substrate may be changed periodically according to a selected frequency or pattern by subjecting the magnetron 124 to a frequency modulator 204.

As mentioned above, the waves of microwave energy radiating from the openings 110 of the leaky coaxial microwave source 104 arise due to standing wave oscillations that occur in the insulating material of the source 104. At constant conditions, current oscillates in the conductors at a selected frequency set by the magnetron 124, and the propagation barrier represented by the distal end 206 of the source 104 reflects the microwave energy back along the source 104 setting up a standing wave within the source 104. The radiation emerges through the openings 110 creating waves with precise waveforms governed by the geometry of the source and the frequency and amplitude of the oscillating current in the source. Adjusting the frequency of the oscillating current changes the standing wave radiation pattern in the insulating material resulting in different intensities at the various openings 110. This, in turn, results in a different intensity pattern impacting the substrate. If the frequency of the magnetron is varied according to a pattern, the intensity pattern of the radiation will also vary according to a related pattern, resulting in an averaging of the interference pattern 202 on the substrate. A controller 208 may be coupled to the frequency modulator 204, which may be a signal generator, to deliver a frequency target to the modulator 204.

The openings in a leaky microwave source such as the microwave source 104 may be arranged according to any desired pattern to achieve a selected radiation pattern. A single rank of openings may be aligned along the major axis of the microwave source 104. In another embodiment, at least two rows of openings are aligned along the major axis of the microwave source 104. The openings in the two rows may be aligned or staggered in the transverse direction. The openings may be generally round, square, rectangular, elliptical, or irregular in shape. The openings may be slots in the outer conductor oriented in the axial or the transverse direction.

The openings typically have at least one dimension smaller than a wavelength of the emitted radiation. Radiation having wavelengths from about 3 cm to about 1 mm may be used to process substrates, so openings in the outer conductor will typically have at least one dimension smaller than about 1 mm. In some embodiments, the openings in the outer conductor may be substantially circular with diameter between about 0.1 mm and about 1 mm. For longer wavelength radiation, the holes may have diameter up to about 1 cm. in some embodiments. In general, the openings will have a dimension of about 2 cm or less, such as between about 0.1 mm and about 1.5 cm, for example about 1 mm.

Distance between the openings may be selected to achieve a particular pattern of radiation at the substrate support. Density of nodes and anti-nodes will increase as distance between the openings is decreased. In a tubular or cable-like emitter, transverse distribution of the openings may be adjusted to achieve a desired transverse propagation angle, coverage area, and interference pattern. Openings may be spaced apart a distance less than a wavelength of the emitted radiation, for example between about 0.1 mm and about 1 cm apart. Openings of diameter up to about 0.5 mm may be distributed along a portion of a coaxial microwave source in a regular, random, or quasi-random pattern. A plurality of such openings may be formed along a surface of the microwave source facing the substrate support. The axial and angular size and distribution of the openings may be independently selected to define a coverage area and intensity distribution of radiation reaching the substrate.

Figure 3:
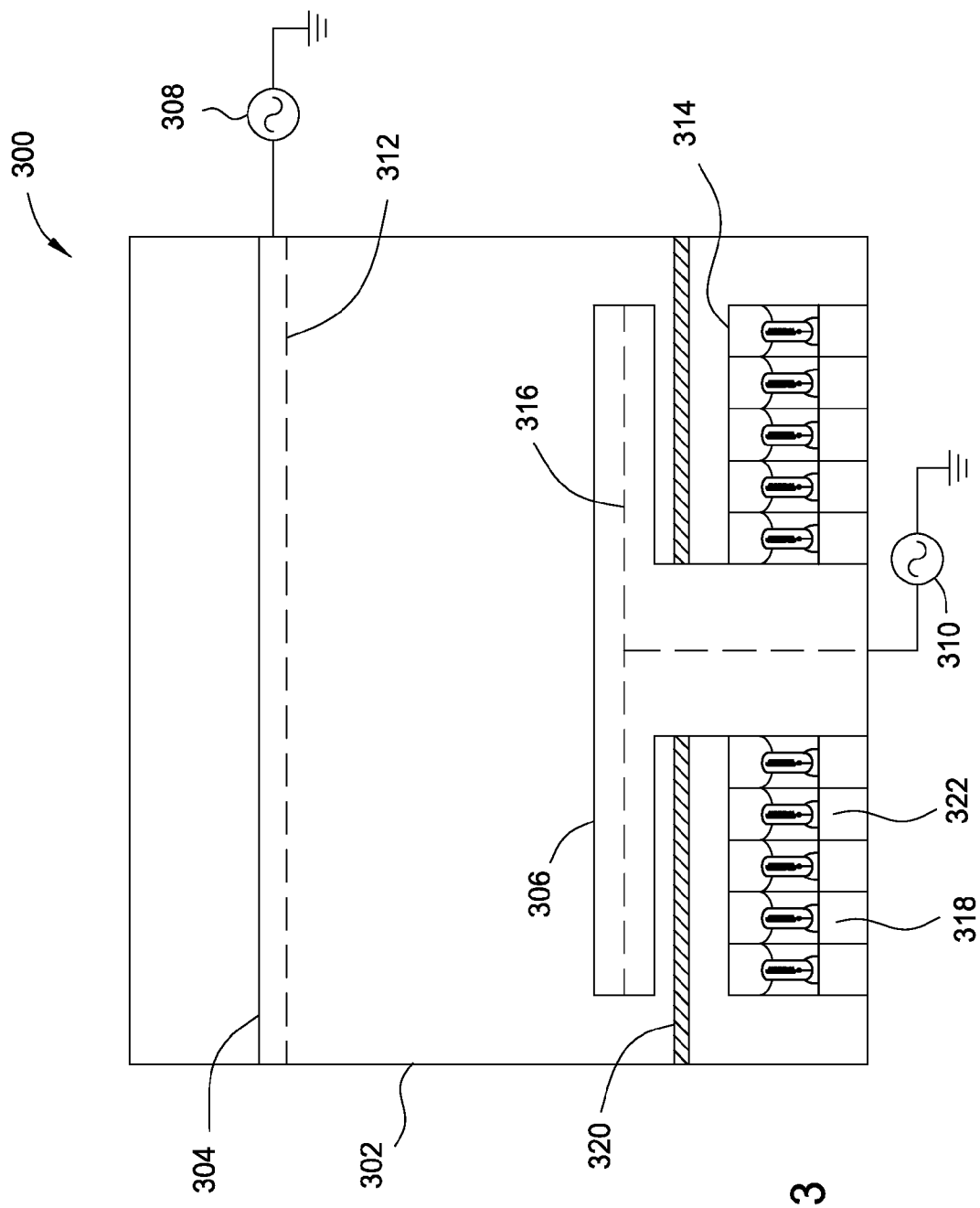
FIG. 3 is a schematic view of a radiation processing chamber according to another embodiment.

Microwave emitters may be coupled with other radiation emitters in an annealing chamber with beneficial effect. FIG. 3 is a cross-sectional view of a radiation processing chamber 300 having a microwave source 304 and a thermal source 314. The radiation processing chamber 300 has an enclosure 302 that encloses a substrate support 306, the microwave source 304, and the thermal source 314. The substrate support 306 may have a conductor 316 disposed therein and coupled to an RF generator 310 for e-chucking a substrate to the substrate support 306. DC power may also be used.

The microwave source 304 is powered by a microwave frequency generator 308, which may be a magnetron. The generator 308 may operate at frequencies between about 600 MHz and about 1 THz. The microwave source 304 has openings 312 in an outer conductor of a coaxial transmitter. Similar to the embodiments described in connection with FIGS. 1A and 2, the openings allow microwaves to radiate from the microwave source 304 toward the substrate support.

It should be noted that the microwave source 304 may be designed to allow high power microwave broadcast at atmospheric conditions without generating a plasma in the vicinity of the source 304. A typical coaxial transmitter carrying high power microwave frequency alternating current may develop a plasma near the transmitter due to concentration of electromagnetic energy near the transmitter. Although the microwaves are substantially confined to the insulating material between the two conductors, a portion of the energy propagates outside the transmitter due to the probabilistic nature of the wave function. The energy propagating outside the transmitter may ionize gas molecules in the vicinity of the transmitter, giving rise to a plasma. Such a plasma may be reactive to some materials encountered in semiconductor processing. Each opening formed in the outer conductor of the coaxial transmitter will allow a portion of the power flowing through the transmitter to escape, reducing the power density near the transmitter and the propensity to ionize gas. Thus, a leaky coaxial source or coplanar source may operate plasma-free at atmospheric conditions.

The thermal source 314 may be a bank of lamps 318, as shown in FIG. 3. The lamps are generally heat producing lamps, such as xenon or halogen lamps, each lamp disposed in a recess 322 with a reflector disposed to maximize the radiation captured from each lamp. The recesses 322 may be arranged in any desired pattern, one example of which is a honeycomb pattern. A window 320 protects the lamps 318 from the processing environment. The window 320 may also have a metal mesh on one surface of the window, or incorporated into the window, to reflect microwaves back to the chamber and away from the lamp assembly. The reflective metal mesh also improves efficiency of the microwave exposure by redirecting microwaves that bypass the substrate support.

The substrate support may have a reflective coating to provide additional protection for the lamps. The reflective coating would be heated by the heat lamps, and would, in turn, heat the substrate. Providing a thermal source and a microwave source in a single chamber allows simultaneous or sequential thermal and microwave processing of substrates.

Figure 4A:
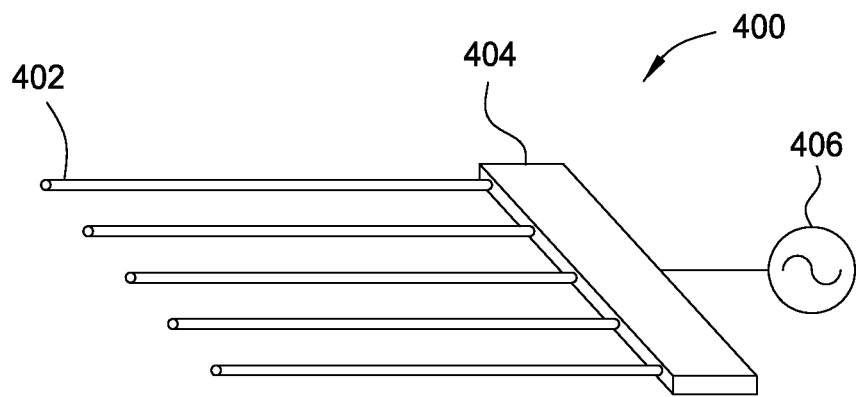
FIGS. 4A and 4B are perspective views of two embodiments of distributed microwave sources.
Figure 4B:
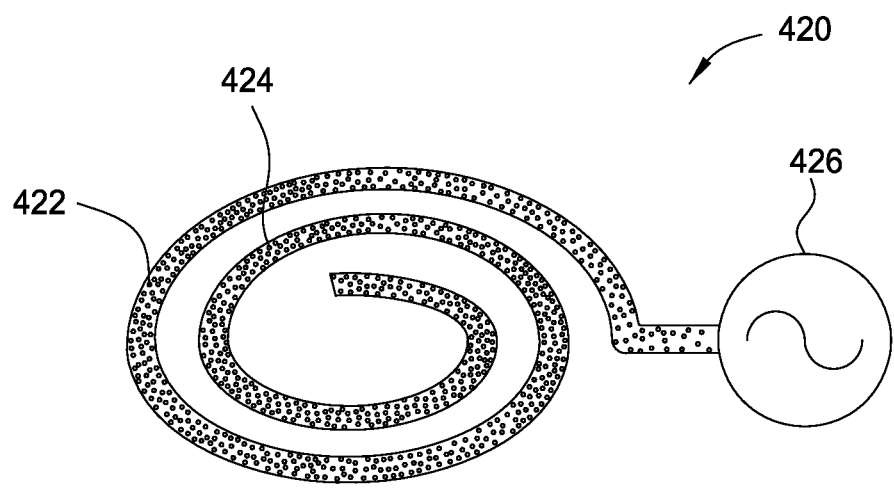
Figure 4C:
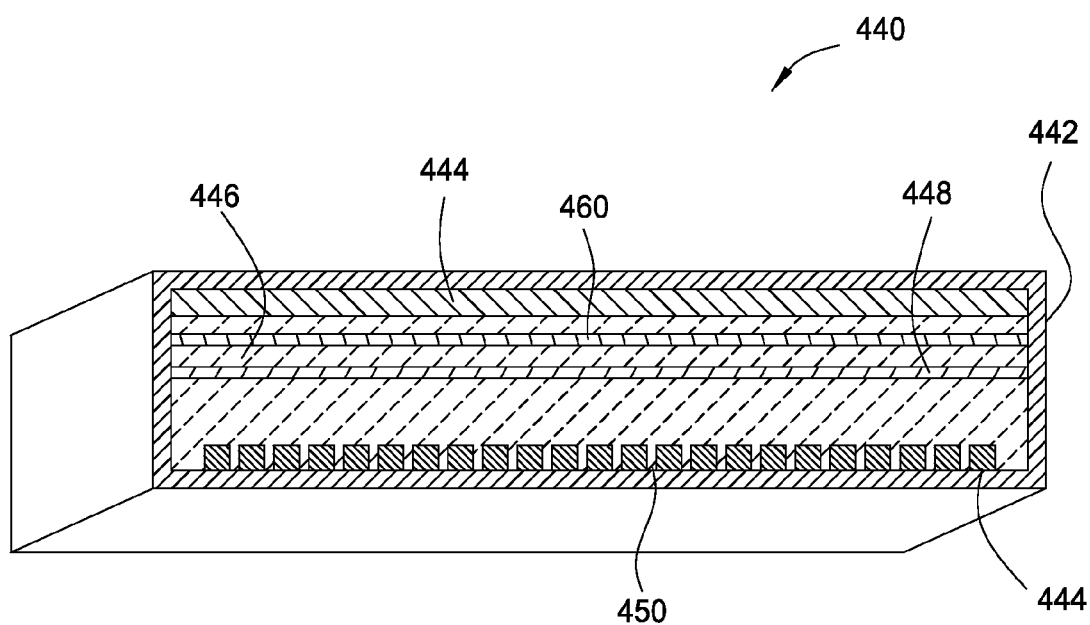
FIG. 4C is a cross-sectional view of a distributed microwave source according to another embodiment.

FIGS. 4A and 4B are perspective views of two distributed microwave source embodiments 400, 420, that may be used in a radiation processing chamber. FIG. 4C is a cross-sectional view of a distributed microwave source 440 according to another embodiment. Each of the microwave sources 400, 420, and 440 is a two-dimensional source for generating a field of microwave energy. The distributed microwave sources 400, 420, and 440 are each leaky sources, similar to the leaky coaxial source 104 of FIG. 1A-2, arranged to cover an area with microwave radiation. The distributed microwave sources 400 and 420 are coaxial sources arranged in a planar arrangement, while the microwave source 440 is a coplanar leaky source.

The microwave source 400 is a plurality of coaxial microwave emitters 402 in a substantially parallel arrangement, with a power divider 404 between the emitters 402 and a microwave frequency power generator 406. The coaxial microwave emitters 402 may be leaky emitters, as described above in connection with FIGS. 1A-2. The power divider 404 may be an n-way power divider circuit or a plurality of dual dividers such as Wilkinson dividers. The power divider 404 is represented as a box in FIG. 4A, but in reality the power divider will be electronic circuitry coupled to each of the emitters 402 and to the generator 406. The electronic circuitry may be entirely passive elements, such as resistors, capacitors, and the like, or active components that allow power balancing between the various emitters as well as impedance matching for the system.

The microwave source 420 is a leaky coaxial microwave emitter 424, similar to the leaky sources described above in connection with FIGS. 1A-2, arranged in a spiral pattern and coupled to a microwave frequency power generator 426. In a chamber, the spiral portion of the source 420 is positioned facing a substrate support such that the emitted microwaves irradiate a substrate positioned thereon. In the embodiment of FIG. 4B, the openings 422 are shown in a quasi-random configuration, but they may be arranged according to any convenient pattern. The emitter 424 may have a protective coating coaxial with the other components of the emitter 424, and/or a protective housing (not shown) encompassing the entire emitter 424.

The microwave source 440 is a coplanar leaky source arrangement having a first conductor 448 and a second conductor 444 separated by an insulating material 446. On a first side of the first conductor 448, the second conductor 444 has a plurality of openings 450 configured as described above in connection with FIG. 1A-2. The openings 450 allow microwave radiation to emerge from between the first conductor 448 and the second conductor 444, as described above. A shield member 460 may be disposed in the insulating material 446 on a second side of the first conductor 448 opposite the first side to reduce radiation propagation away from the openings 450. The conductors 448 and 444 are generally metal, and may have a high conductance outer layer to manage the skin effect, as described above in connection with leaky coaxial sources. The insulating material 446 may be any of the insulating materials described above, and the coating 442 will be a material selected to withstand the processing environment.

Power is coupled to the first conductor 448 at a single contact point or a plurality of contact points. Coupling power at a plurality of contact points may result in a more uniform radiation field emanating from the openings 450, but such coupling will benefit from power division circuitry to ensure relatively uniform power is applied across the first conductor 448.

Each of the distributed microwave sources 4A-4C is a planar microwave source, emitting microwaves as a plurality of point sources arranged in a plane. Microwaves emitted from the sources interfere to produce a pattern of high and low intensity which can be phase modulated, as described above in connection with FIG. 2, to improve the uniformity of the incident radiation. For example, a phase modulator may be applied to each of the emitters 402 of the distributed source 400 between the emitter 402 and the power divider 404, or a phase modulator may be interposed between the power divider 404 and the generator 406.

Figure 5:
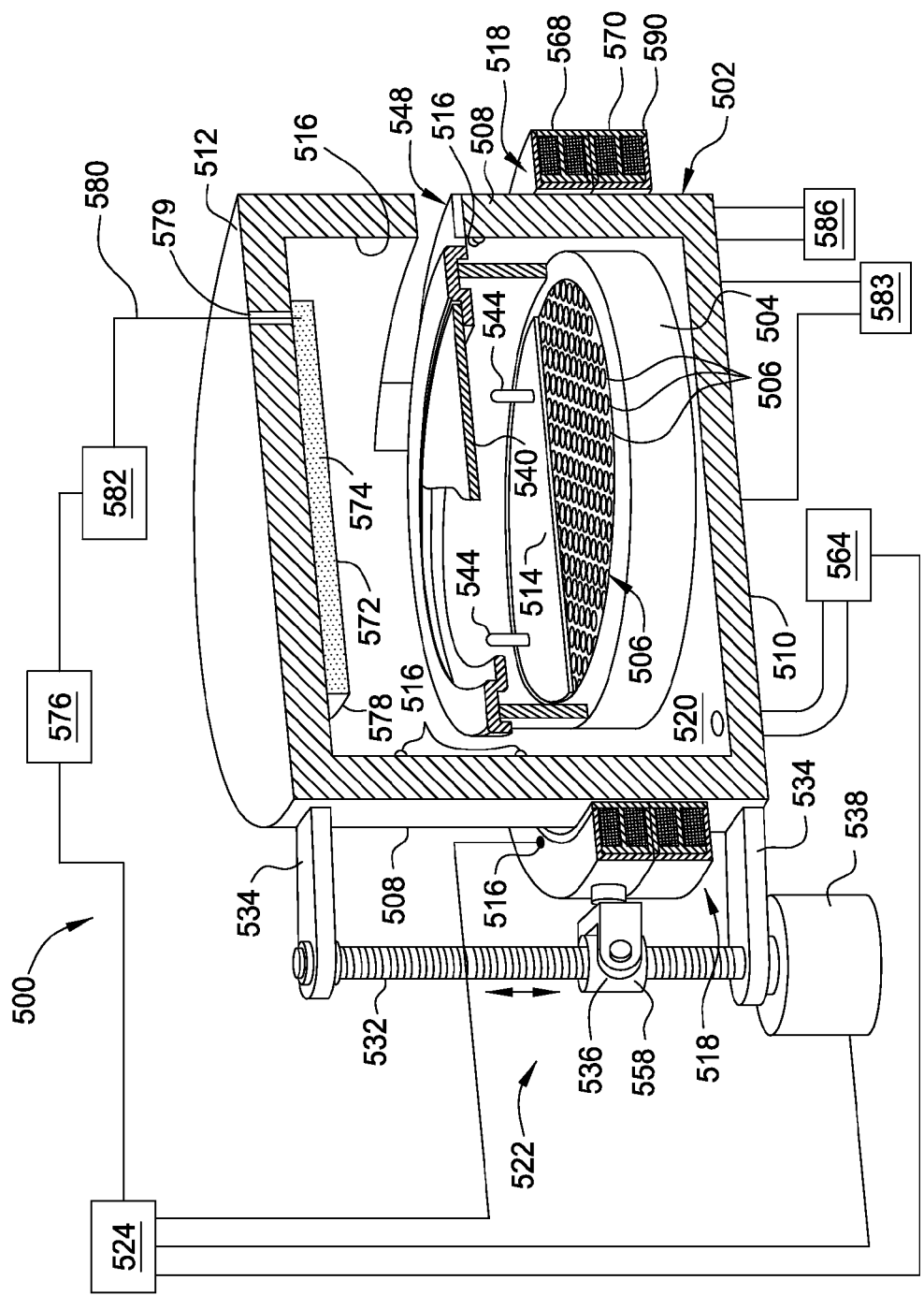
FIG. 5 is a cutaway view of a radiation processing chamber according to another embodiment.

FIG. 5 is a cross-sectional perspective view of a radiation processing chamber 500 according to another embodiment. The radiation processing chamber 500 includes a substrate support 504, a chamber body 502 having walls 508, a first end 510 and a second end 512, the walls 508 and first and second ends 510 and 512 defining an interior volume 520. The walls 508 include a substrate access port 548. The substrate support 504 may be annular.

A radiant heat source 506 is disposed in the substrate support 504. The radiant heat source 506 comprises a plurality of lamps (not shown) disposed in a plurality of tubes 560, forming a lamp array. A window 514 is disposed between the lamp array and the processing environment to protect the lamp array from process gases in the chamber. The window 514 is transparent to wavelengths of radiation emitted by the lamps, and is typically formed from a material resistant to thermal processing conditions, such as quartz or sapphire. A plurality of lift pins 544 may be coupled to an upper surface of the window 514 to selectively contact a substrate 540 disposed on the substrate support 504 to facilitate transfer of the substrate 540 into and out of the chamber 500.

The radiant heat source 506 includes a plurality of honeycomb tubes 560 that house the lamps in a coolant assembly (not shown) coupled to a coolant source 583, which may be one or a combination of water, ethylene glycol, nitrogen, and helium. The coolant source 583 also cools the walls 508 of the chamber 500 by flowing through coolant channels (not shown) formed therein. Each tube 560 may have a reflector, and the tubes 560 may be arranged in a hexagonal arrangement. The radiant heat source 506 may comprise annular zones, wherein the voltage supplied to the tubes 560 is varied by operation of a controller to adjust the radiant energy to different parts of the substrate 540.

Rotation of the substrate support 504 is facilitated by a stator assembly 518 disposed around the walls 508 of the chamber body 502. The stator assembly 518 is coupled to one or more actuator assemblies 522 that control the elevation of the stator assembly 518 along the exterior of the chamber body 502. The stator assembly 518 is magnetically coupled to the substrate support 504 by a magnetic rotor (not shown) disposed in the substrate support 504. The stator assembly 518 may also include a housing 590. In one embodiment, the stator assembly 518 includes a drive coil assembly 568 stacked on a suspension coil assembly 570. The drive coil assembly 568 is adapted to rotate and/or raise/lower the substrate support 504 while the suspension coil assembly 570 passively centers the substrate support 504 in the chamber 500.

A microwave source 574 is disposed in the chamber 500 opposite the substrate support 504. The microwave source 572 includes a distributed emitter 574, which may be disposed in a housing 578. The distributed emitter 574 may be otherwise similar to the distributed source 420 of FIG. 4B. The distributed emitter 574 may also be a coplanar source similar to the coplanar source 440 of FIG. 4C, albeit with a circular footprint rather than a rectangular footprint. A microwave supply 582, such as a magnetron, a klystron, or other type of microwave supply, is coupled to the emitter 574 by a lead 580, which may be a coaxial cable. The lead 580 enters the housing 578 through an opening 579 in the second end 512 of the chamber body 502. The housing 572 may be formed from a material substantially transparent to microwaves, such as a ceramic, glass, or quartz material, or the emitter 574 may be disposed in the housing 572 leaving a portion of the emitter 574 exposed to the chamber interior volume 520, such that the openings in the emitter 574 may emit microwaves into the chamber interior volume 520. A frequency modulator 576 may be coupled to the microwave supply 582 to adjust the phase of emitted microwaves at a high frequency, as described above. A phase modulator (not shown) may be included in addition to, or instead of, the frequency modulator 576.

An atmosphere control system 564 is coupled to the interior volume 520 of the chamber body 502. The atmosphere control system 564 includes throttle valves and vacuum pumps for controlling chamber pressure, and gas sources for providing process gases.

In one embodiment, each actuator assembly 522 has a precision lead screw 532 coupled between two flanges 534 extending from the walls 508 of the chamber body 502. The lead screw 532 has a nut 558 that axially travels along the lead screw 532 as the screw rotates. A coupling 536 coupled the stator 518 to the nut 558, so that as the lead screw 532 is rotated, the coupling 536 moves along the lead screw 532 and controls the elevation of the stator 518. A motor 538 is provided to control rotation to the lead screw 532 in response to a signal from a controller 524.

The controller 524 is coupled to the actuator assembly 522, as described above, and to the atmosphere control system 564, the microwave source 574 through the generator 582 and the frequency modulator 576, and to sensors 516 disposed in the chamber body 502 to sense the elevation of the substrate support 504. The sensors 516 provide a positional signal to the controller indicating the position of the substrate support 504 within the chamber. The controller 524 controls the actuator assembly 522 to position the substrate support 504 within the chamber 500 in response to the positional signal provided by the sensors 516. The sensors 516 may be ultrasonic, laser, inductive, capacitive, or any other type of proximity sensor. The sensors may be positioned inside the interior volume 520 of the chamber body 502, or outside the chamber body 502 on the chamber wall 508 or the actuator assembly 522, or any combination thereof.

Figure 6A:
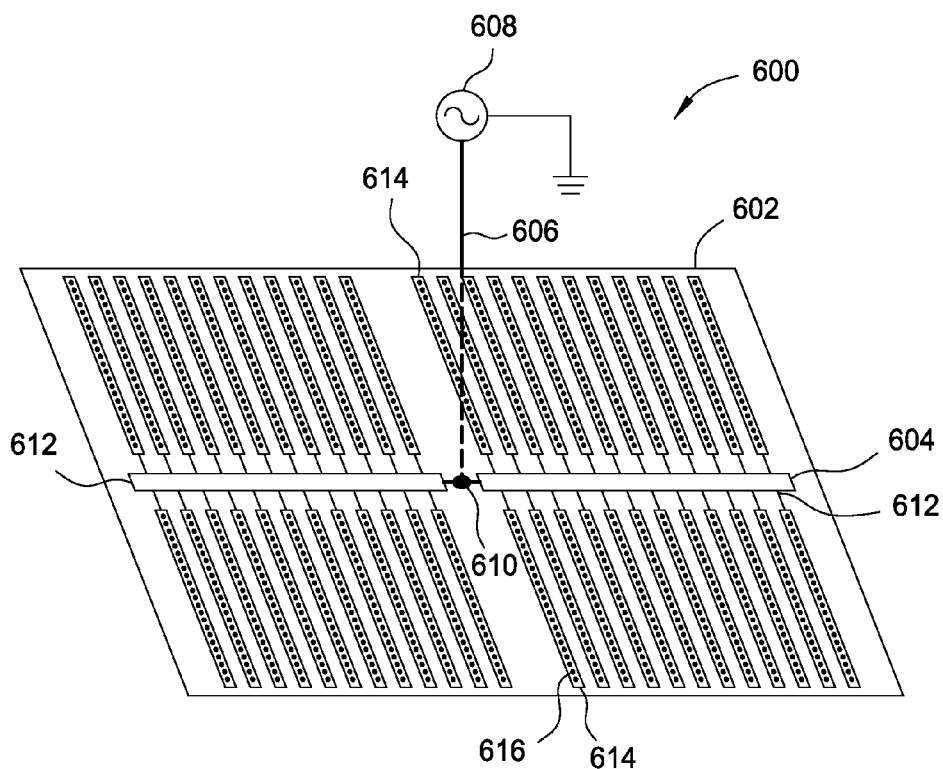
FIG. 6A is a perspective view of a distributed microwave source according to another embodiment.

FIG. 6A is a perspective view of a distributed microwave source array 600 according to another embodiment. The distributed microwave source array 600 comprises a support 602 supporting an array 604 of microwave emitters. The support may be any structurally strong material on which conductive materials such as wires, tubes, and the like may be held. The support is usually made from a material that is not adversely affected by microwave or millimeter wave radiation. Ceramic, plastic, or metal may be used. Ceramic and plastic are mostly transparent to microwave and millimeter wave radiation, but metal will reflect such radiation. Forming the support 602 from metal may be useful for creating desired wave modes within a processing chamber in which the array 600 is disposed.

A power lead 606 carries microwave frequency power from a microwave frequency power source 608 to the array 604. The power lead 606 is usually a coaxial cable or tube to avoid emission of microwave radiation outside the processing chamber, and the power source 608 may be a microwave magnetron operating at any resonant frequency between about 600 MHz and about 1 THz, such as about 2.45 GHz. The power source 608 generates a varying voltage in the power lead 606, which gives rise to the microwave frequency emissions, which are confined within the coaxial power lead 606.

The power lead 606 couples to the array 604 at a first-tier power divider 610. The first-tier power divider 610 may employ any convenient power division circuit, such as a Wilkinson divider. In the embodiment of FIG. 6A, the first-tier power divider 610 is a two-way power divider that sends power evenly to two halves of the array 604. Each half of the array 604 is denominated by a second-tier power divider 612 that evenly divides power from the first-tier power divider 610 to a plurality of third-tier power dividers 614. The third-tier power dividers 614 divide power evenly among emitters 616 protruding from each of the third-tier power dividers 614. As in FIG. 4A, the power dividers are represented as boxes, but in reality comprise electronic circuitry.

Power is generally distributed throughout the array 604 using coaxial conductors to confine the emission of microwaves to a plurality of emitters 616 emerging from each of the third-tier power dividers 614. The emitters 616 may be bare conductors coupled to the central conductor of a coaxial cable. With the outer conductor removed, the emitters 616 emit radiation arising from the alternating current within the emitters 616.

Figure 6B:
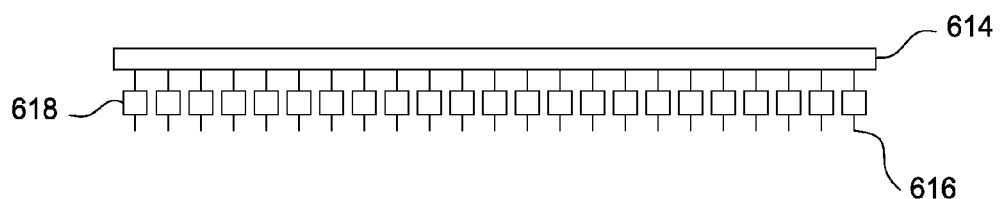
FIG. 6B is a side view of the distributed microwave source of FIG. 6A.

FIG. 6B is a side view of one of the third-tier power dividers 614 showing the emitters 616 protruding therefrom. Each emitter 616 may be phase modulated by coupling a phase modulation circuit 618 to the emitter 616. Voltage may be coupled to each phase modulator 618 through independent circuitry formed in the distributed microwave source array 600, not shown in FIG. 6A. In this way, the distributed microwave source array 600 may be a phased array. Variable components (inductors, resistors, and/or capacitors) may be included in the phase modulation circuitry of each phase modulator 618, or of selected phase modulators 618, to vary the modulation of the microwaves emitted by the array 600 such that an interference pattern of the emitted radiation varies. High frequency phase modulation, with and without variation, may be useful in improving uniformity of the emitted radiation field. A microwave phased array such as the array 600 of FIG. 6A may be formed as a printed circuit in some embodiments.

Figure 7A:
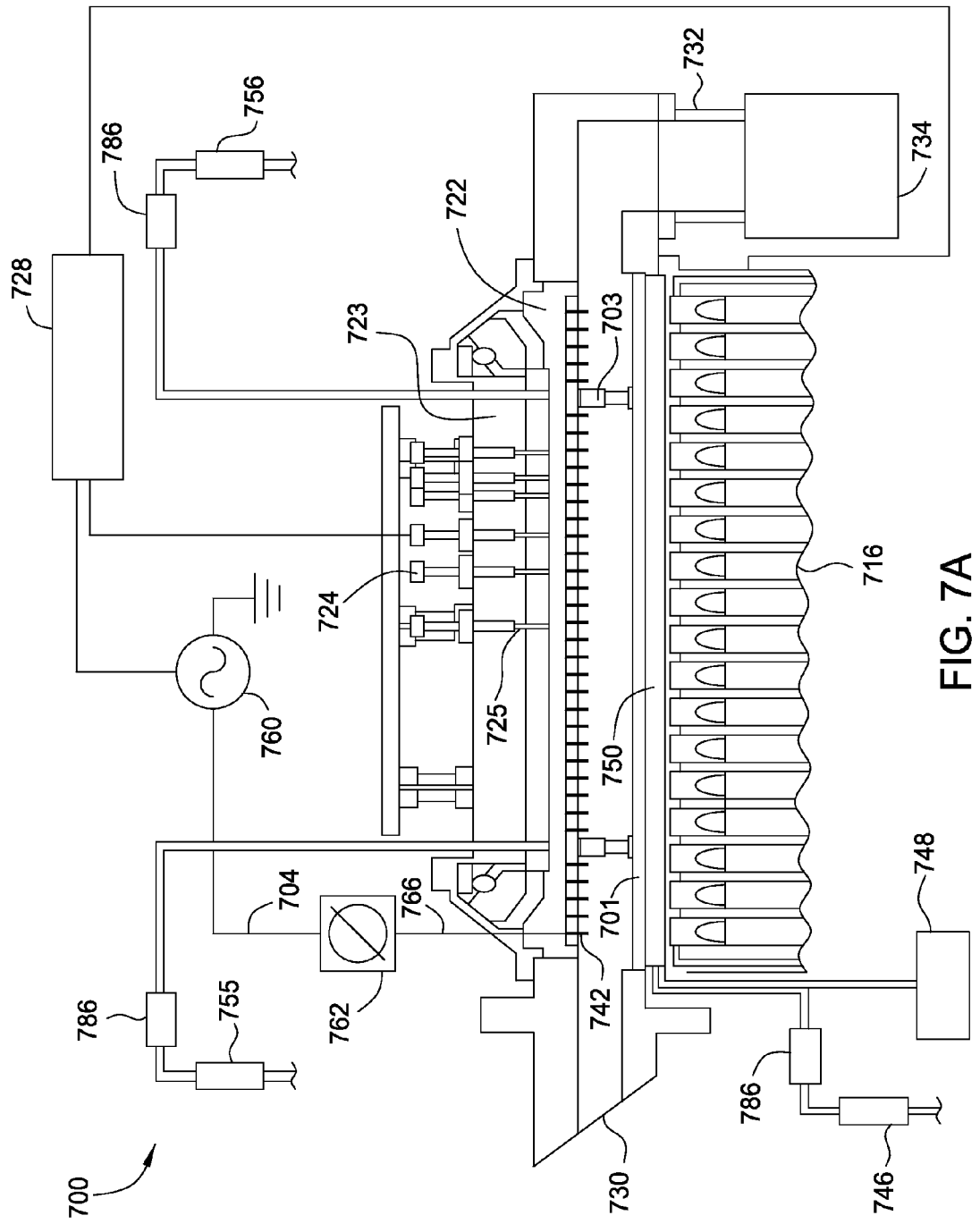
FIG. 7A is a cross-sectional view of a radiation processing chamber according to another embodiment.

FIG. 7A is a cross-sectional view of a radiation processing chamber 700 according to another embodiment. A heat lamp assembly 716 comprising a plurality of honeycomb tubes in a water jacket assembly is disposed on one side of a substrate support 750. Each tube of the heat lamp assembly 716 contains a reflector and a tungsten halogen or xenon lamp.

The substrate support 750 is coupled to a gas supply 746 that provides a low flow of gas to the substrate support 750 to elevate a substrate disposed thereon. The gas emerges from openings (not shown) in the substrate support beneath the substrate. Pumps 547 and 548 apply suction to other openings (not shown) in the substrate support 750 beneath the substrate to evacuate the gas. The substrate is thus positioned above the substrate support 750 by a gas bearing. An exemplary substrate support is further described in U.S. Patent Publication 2008/0276864, paragraphs [0029]-[0041] of which are incorporated herein by reference.

A reflector assembly 722 is disposed opposite the substrate support 750. The reflector assembly 722 has a reflective surface formed by a reflective coating mounted on a water-cooled base 723. A cooling gas may also be injected into the reflector assembly 722 by gas supply 755. A plurality of temperature probes 724 are disposed through ports 725 that extend through the top surface of the reflector assembly 722. A controller 728 may be disposed to receive signals from the temperature probes 724 indicating a temperature of the substrate at various points. The controller may be configured to control the heat lamp assembly 716 in response to the signals from the temperature probes 724.

The reflector assembly 722 may further comprise a plurality of microwave emitters 742 extending from the reflective surface of the reflector assembly 722. The microwave emitters 742 may be coupled to a microwave frequency power generator 760 through an optional phase modulation and power division circuit 762. The generator 760 may also be coupled to the controller 728. The controller 728 may be coupled to the phase modulation and power division circuit 762 to control the application of power to the emitters 742. The controller 728 may also send frequency modulation signals to the generator 760.

Figure 7B:
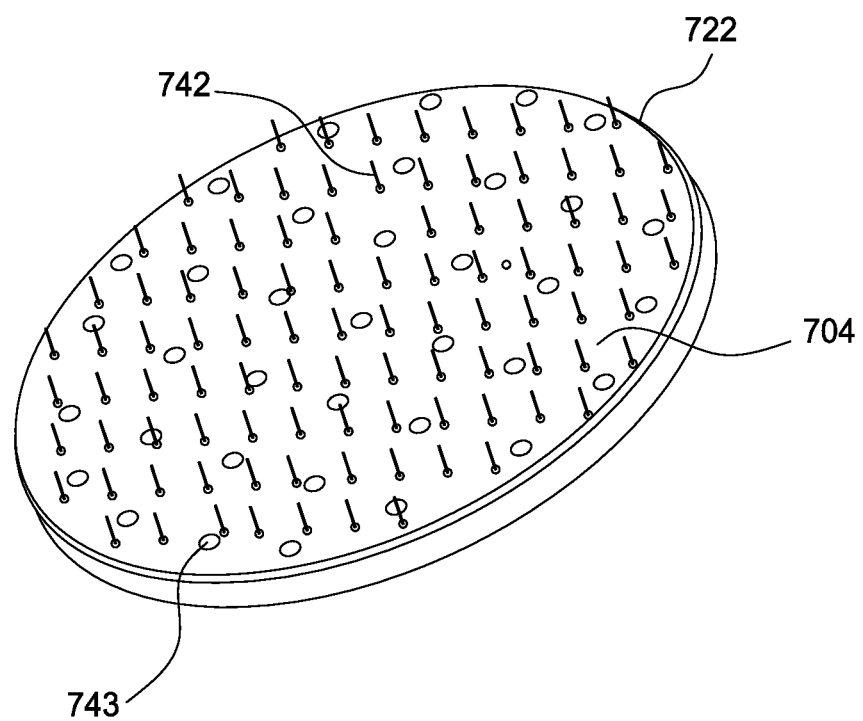
FIG. 7B is a perspective view of a reflective microwave source from FIG. 7A.

FIG. 7B is a perspective view of the reflector assembly 722 of FIG. 7A. The reflector assembly may be nickel-plated aluminum in one embodiment. Openings 743 accommodate the temperature probes 724. The microwave emitters 742 may be conductors protruding from the reflective surface 704 of the reflector assembly 722. The reflective surface directs microwave energy emitted toward the reflector assembly toward the substrate, improving energy utilization.

During an annealing process, the controller 728 may energize the lamp assembly 716 to provide thermal energy to a substrate disposed on the substrate support 750. The temperature probes 724 register a temperature rise within the substrate, which the controller 728 uses to achieve a background temperature of the substrate. The controller 728 may then energize the microwave generator 760 to produce microwave energy from the emitters 742. The controller 728 may also apply frequency modulation and phase modulation by sending signals to the generator 760 and the phase modulator 762. The resulting uniformized microwave energy penetrates the substrate surface, rearranging the defects and interstitials to improve crystal structure and activate dopants.

Figure 8:
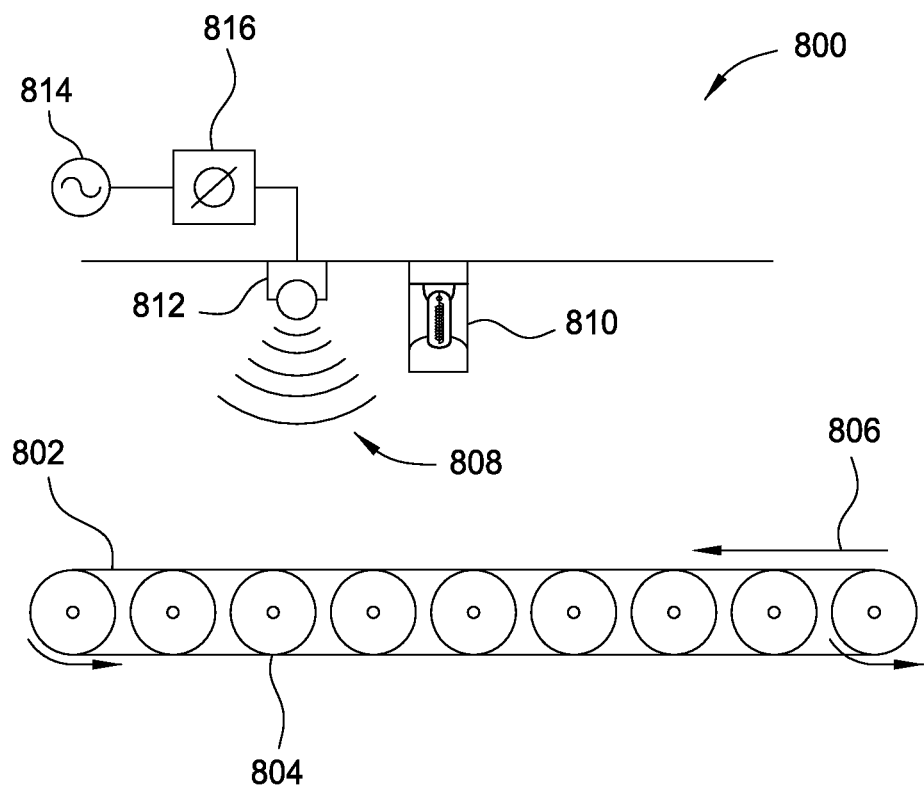
FIG. 8 is a schematic side view of a dynamic annealing chamber according to another embodiment.

FIG. 8 is a schematic side view of a dynamic annealing chamber 800 according to another embodiment. The chamber 800 has a moving substrate support 802 actuated, in this embodiment, by rollers 804 such that a substrate disposed on the support 802 moves in the direction indicated by arrow 806. The substrate enters a processing zone roughly defined by a thermal energy emitter 810 and a microwave energy emitter 812. Both the thermal energy emitter 810 and the microwave energy emitter 812 are extended sources that have a linear dimension perpendicular to the plane of the cross-sectional view of FIG. 8. The thermal energy emitter 810 may be a plurality of heat lamps arranged in a linear fashion across the moving substrate support 802. The microwave energy emitter 812 may be a leaky coaxial source, as described above in connection with FIGS. 1A and 1B, extending across the moving substrate support 802. The microwave energy emitter 812 may be coupled to a microwave (or millimeter wave or terahertz) frequency generator 814, and a phase modulator 816 may be disposed between the microwave energy emitter 812 and the microwave frequency generator 814, as further described elsewhere herein. Alternately, and/or optionally, a frequency modulator (not shown) may be applied to the microwave frequency generator 814 as described elsewhere herein.

The dynamic annealing chamber 800 sequentially exposes a substrate to thermal and microwave or millimeter wave energy to anneal the substrate. A distance between the microwave energy emitter 812 and the thermal energy emitter 810 is selected to provide a defined overlap between the two forms of energy. Depending on the intensity profile of the emitters 810 and 812, and the speed of the moving substrate support 802, the distance between the two emitters may be determined to provide a precise overlap of thermal and microwave energy to the substrate. The thermal energy provided by the thermal emitter 810 may increase the effectiveness of the microwave energy by lowering the energy barrier to reorganization of the lattice. In one embodiment, the distance between the two emitters may be defined such that a power density of microwaves emitted by the microwave emitter 812 is between about 1.5 W/cm² and about 2.5 W/cm² when a temperature of the substrate surface is between about 300° C. and about 500° C.

Figure 9:
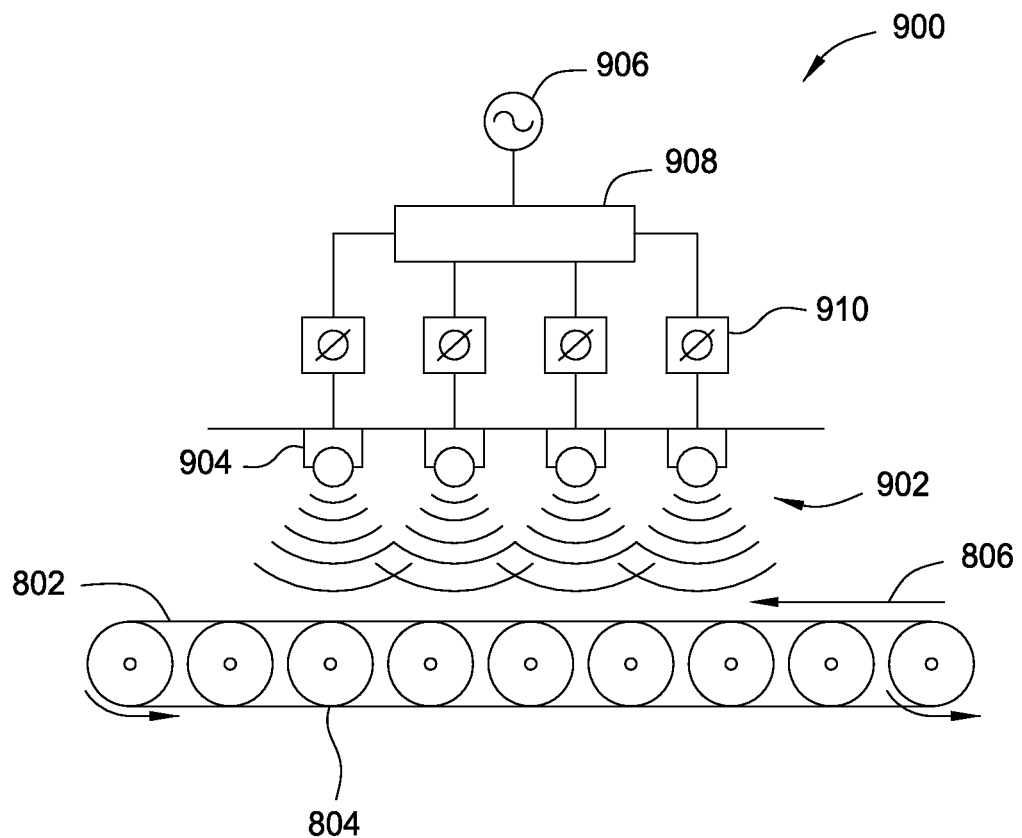
FIG. 9 is a schematic side view of a dynamic annealing chamber according to another embodiment.

FIG. 9 is a cross-sectional view of a dynamic annealing chamber 900 according to another embodiment. The dynamic annealing chamber 900 has a moving substrate support 802, as in FIG. 8, and a plurality of microwave energy emitters 904 arranged along the transport direction of arrow 806. Like the microwave energy emitter 804 of FIG. 8, each of the emitters 904 has a linear dimension perpendicular to the cross-section of FIG. 9, such that each emitter 904 extends across the moving substrate support 804. Each of the microwave energy emitters 904 is a leaky coaxial source, as described in connection with FIGS. 1A and 1B, emitting microwaves over an area that extends in the transport direction of arrow 806 and across the moving substrate support. In this embodiment, interference patterns may be averaged across the moving substrate support, transverse to the transport direction of arrow 806, by coupling a phase modulator 910 to each emitter. A power divider 908 evenly distributes power from a microwave frequency generator 906, through each phase modulator 910, to the emitters 904. Some averaging of interference patterns may be realized in the transport direction of arrow 806 if the phase modulation of each modulator 910 is varied at a different frequency. Alternately, the emitters 910 may be spaced apart a distance selected to create a zone of low power density between each emitter 910, such that interference in the direction of transport is inconsequential.

Figure 10:
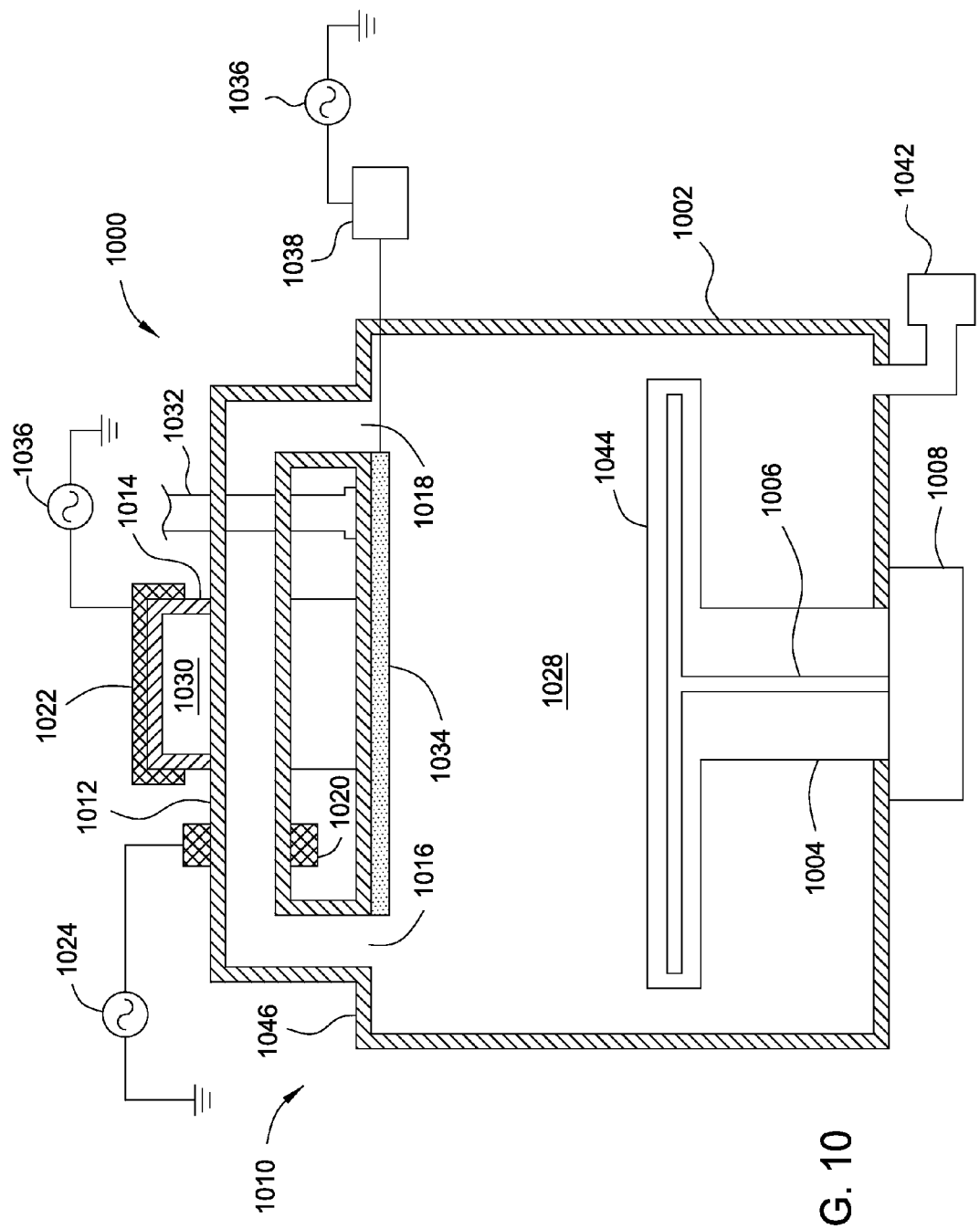
FIG. 10 is a cross-sectional view of an ion immersion chamber with a microwave source according to another embodiment.

FIG. 10 is a cross-sectional view of an ion immersion chamber 1000 according to another embodiment. The chamber 1000 has an enclosure 1002 defining an internal volume 1028 in which a substrate support 1004 is disposed. The substrate support 1004 has at least one internal conduit 1006 through which vacuum, electric power, or cooling fluids may be routed to the substrate receiving surface 1044 of the substrate support 1004.

The chamber 1000 features two reentrant conduits 1012 and 1014 through which process gases may flow from the internal volume 1028 of the chamber 1000. The reentrant conduits 1012 and 1014 terminate at openings 1018 in a wal 1046*l* of the chamber 1000. The openings 1018 for a single reentrant conduit, for example the reentrant conduit 1012, are positioned on opposite sides of the chamber 1000, and the reentrant conduits 1012 and 1014 are oriented substantially perpendicular to each other. Thus, a midpoint of the reentrant conduit 1012 and a midpoint of the reentrant conduit 1014 coincide approximately above a central area of the chamber wall 1046.

Each of the reentrant conduits 1012 and 1014 has a inductive core 1020 and 1022 disposed around the reentrant conduit. The inductive cores 1020 and 1022 are wrapped with coils that are electrically coupled to RF sourced 1024 and 1036. RF energy is applied to each conductive core forming an inductive field inside each reentrant conduit 1012 and 1014 that ionizes gases flowing therein to produce a plasma. The plasma flows from each of the reentrant conduits 1012 and 1014 into the internal volume 1028 of the chamber. The reactive components of the plasma then deposit on, implant into, or etch a substrate disposed on the substrate support 1004.

The chamber 1000 may be used to perform a material operation on a substrate, as described above, as well as a radiation operation. A microwave source 1034 is disposed along the wall 1046 of the chamber 1000 opposite the substrate receiving surface 1044. The microwave source 1034 may be any of the sources described herein, and may be coupled to a microwave frequency generator 1036 by an optional phase modulator 1038. As described elsewhere herein, the generator 1036 may also be frequency modulated. The microwave source 1034 is enclosed by a material resistant to the processing environment of the chamber 1000 but also transparent to microwaves. The material of the enclosure may be changed by the process environment so long as the structural strength and microwave transparency of the material are not substantially degraded and microwave absorptivity substantially enhanced by the process environment. The material of the enclosure may also be selected to withstand a cleaning chemistry that may be applied to the chamber from time to time. In one embodiment, the enclosure material is formed from silicon, carbon, or a mixture thereof (e.g. silicon carbide, carbon-doped silicon, carbon-rich silicon, silicon-doped carbon), which may be amorphous or crystalline.

In operation, a process gas may be provided to the chamber 1000 through a conduit 1032 coupled to a portal (not shown) in the wall 1046 thereof. Process gases may be exhausted through a portal 1040 to a vacuum source 1042, and pressure of the chamber 1000 regulated thereby. The inductive cores 1020 and 1022 are energized with RF power to form a plasma, and the substrate is exposed to the plasma for a time period to perform a material operation. After the material operation, the chamber 1000 may be evacuated by pumping down, and the microwave source 1034 energized. Phase modulation and/or frequency modulation may be applied to improve uniformity of the radiation impacting the substrate surface. The microwave energy repairs defects in the crystal structure of the substrate surface, penetrating only to the skin depth without bulk heating the substrate. Cooling may be applied to the substrate to maintain a bulk temperature of the substrate below about 500° C. to ensure diffusion of impurities is minimized. The material operation is an ion implantation operation in one embodiment, and the microwave energy anneals the implanted substrate in the same chamber.

In another operation, the microwave source 1034 may be pulsed to ignite the plasma in the chamber 1000, or the microwave source 1034 may be operated in repeated pulsed mode to anneal the substrate. The microwave source 1034 may also be operated continuously, or in pulsed mode, during plasma processing to maintain the plasma in the chamber and/or to apply electromagnetic energy to the substrate surface during the material process. Such electromagnetic energy may increase implant depth at a given ion density and/or temperature, which may be useful for some embodiments, and may also anneal the substrate during implanting, reducing overall processing time. It should be noted that in some embodiments, an RF bias may be applied to the substrate through the substrate support by a mesh electrode (not shown) disposed in the substrate support. Application of microwave energy during implant may reduce the bias needed to perform the implant in some cases.

Figure 11:
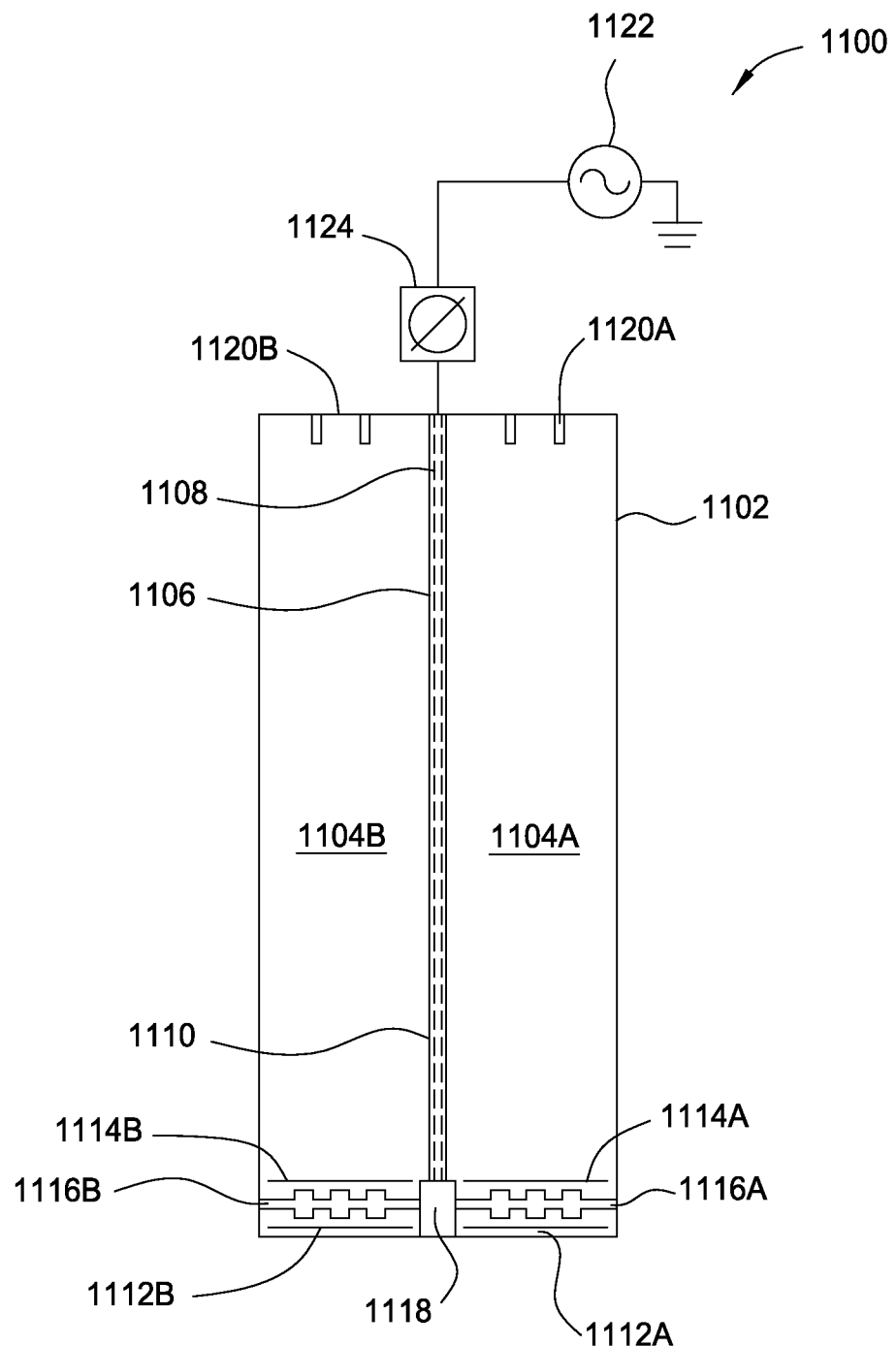
FIG. 11 is a cross-sectional view of a vertical annealing chamber according to another embodiment.

FIG. 11 is a cross-sectional view of a vertical annealing chamber 1100 according to another embodiment. The vertical annealing chamber 1100 may be used to anneal substrates in a substantially vertical orientation. An enclosure 1102 encloses a leaky microwave source 1106 having openings on two sides, each side facing a substrate processing zone 1104 NB. The microwave source 1106 is a leaky coaxial source as described elsewhere herein, with an inner conductor and an outer conductor having the openings both disposed in the interior 1108 of the microwave source 1106. The microwave source 1106 is coated with a resistant coating 1110 that substantially covers the openings.

Each of the substrate processing zones 1104 NB has a conveyor 1114 that is actuated by rollers 1116. The rollers are actuated by a motor disposed in a motor block 1118. The microwave source 1106 is secured to the motor block 1118 as well. The substrates travel along the moving conveyors 1114A/B past the microwave source 1106 in a substantially vertical orientation maintained by respective guides 1120A/B. The microwave source 1106 is energized by microwave frequency generator 1122, optionally interposed by a phase modulator 1124 and optionally adjusted by a frequency modulator (not shown) coupled to the generator 1122. Microwave energy emitted by the microwave source 1106 projects outward from the microwave source 1106 toward the substrates travelling past on the conveyors 1114A/B, annealing the substrate surface as the substrates pass.

The mechanisms of the motor block 1118 and rollers 1116 may be protected from microwave radiation by coating the motor block 1118 and the conveyor 1114 with metal. The conveyor 114 may be a compliant material coated along its outer surface with a metal foil, if desired, or a sheet of metal foil may be incorporated internally into the conveyor 1114. Alternately, a foil mesh or wire mesh may be incorporated into the conveyor 1114, or the conveyor 1114 may be a compliant material impregnated with metal particles.

Figure 12:
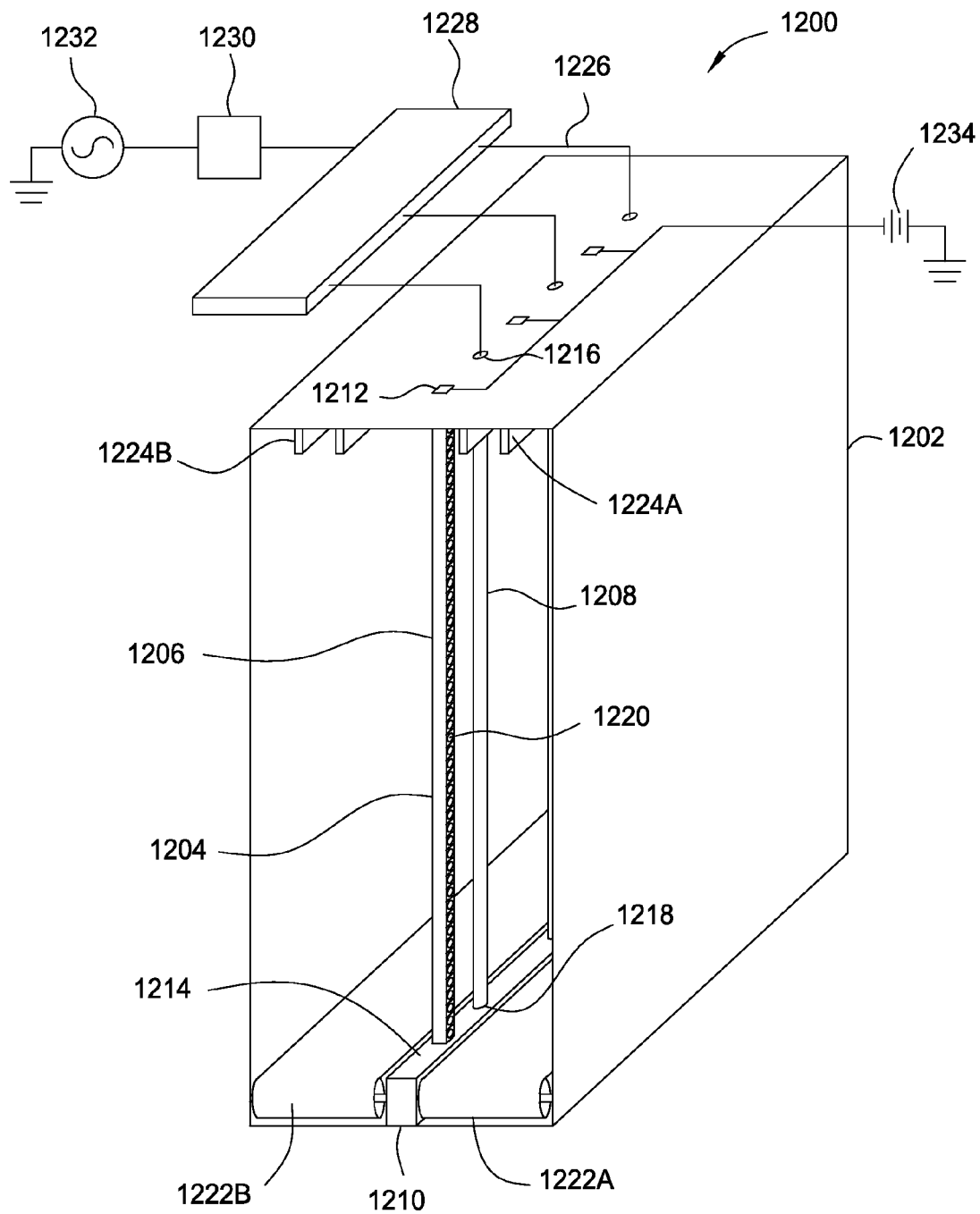
FIG. 12 is a perspective view of a vertical radiation processing chamber according to another embodiment.

FIG. 12 is a perspective view of a vertical radiation processing chamber 1200 according to another embodiment. The vertical radiation processing chamber 1200 is generally similar in many respects to the vertical annealing chamber of FIG. 11, with multiple thermal and microwave energy sources 1204 and 1208, respectively, included in the interior of the chamber 1200. An enclosure 1202 encloses motorized conveyors 1222A/B, as with the chamber 1100, and a radiation assembly 1240 in a central portion of the chamber 1200 facing the two substrate processing zones. The radiation assembly 1240 comprises alternating thermal and microwave sources 1204 and 1208 along a length of the chamber 1200 for performing alternate thermal and microwave processes on substrates passing through. The substrate are maintained in a substantially vertical orientation by guides 1224A/B, as in the chamber 1100, and terminals 1212 and 1216 of the thermal and microwave sources, respectively, couple to respective power sources 1234 and 1232 through the top of the chamber. The power source 1232 is a microwave frequency power source coupled to the microwave sources 1208 by leads 1226, that couple to a phase modulator 1230 through a power divider 1228. The microwave sources 1208 may be double-sided sources, as the source 1106 of the chamber 1100, or single-sided sources in alternating configurations (i.e. one source pointing toward the "A" side, the next pointing toward the "B" side, etc.).

Each thermal source 1204 is a line of heat lamps 1220 in a housing 1206. The housing 1206 may be metal to protect the lamps from microwave emissions. The thermal sources 1204 may also be double-sided, if desired, with heat lamps projecting toward the "A" side and the "B" side. The thermal sources 1204 and microwave sources 1206 terminate at the motor block 1210, which houses a motor to actuate the conveyors 1222. As with the chamber 1100, the motor block 1210 and conveyors 1222 may be metal, metal coated, metal impregnated, or have metal incorporated in them to resist microwaves.

Figure 13:
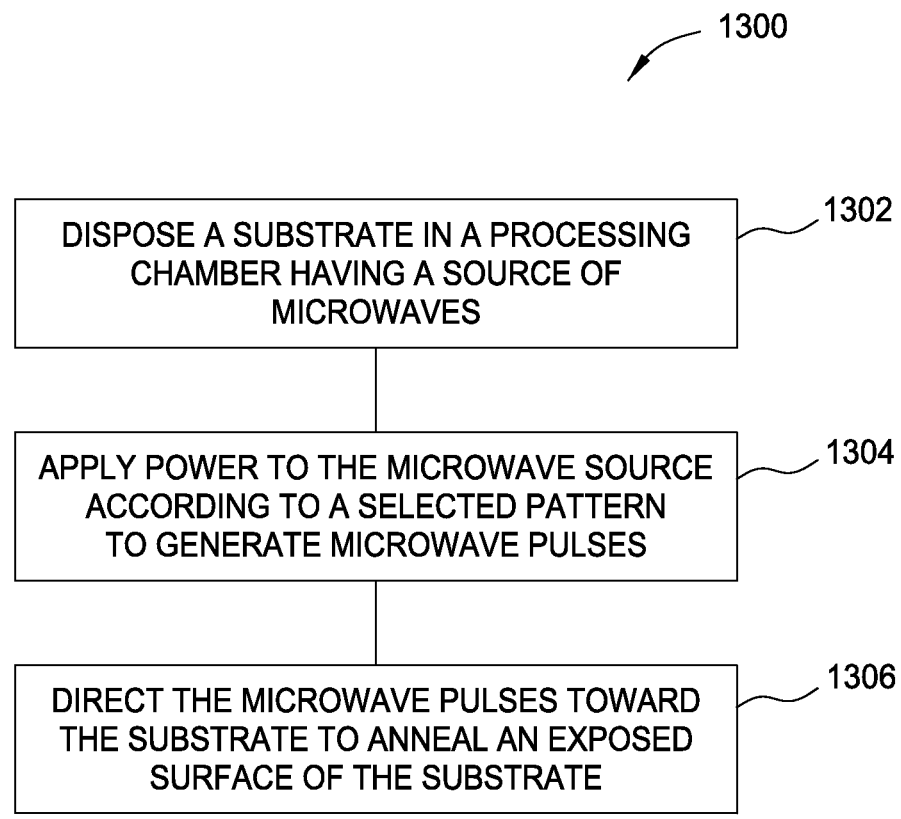
FIG. 13 is a flow diagram summarizing a method according to another embodiment.

FIG. 13 is a flow diagram summarizing a method 1300 of annealing semiconductor substrates according to another embodiment. At 1302, a substrate is disposed in a chamber having a microwave source, which may be any of the microwave sources described herein. The microwave source is energized by applying a varying voltage to the microwave source at 1304. The microwave source is repeatedly energized at a selected frequency to produce a pulsed microwave energy. Each pulse may have energy density between about 0.2 W/cm$^2$ and about 5 W/cm$^2$, such as about 2 W/cm$^2$, and a duration between about 1 µsec and about 100 msec. The substrate is typically exposed to between about 1 and about 100,000,000 pulses of microwave energy, depending on pulse characteristics, such as between about 5 and about 100 pulses, for example about 20 pulses. In some embodiments, phase modulation may be applied to improve uniformity of a collection of emitters or a field emitter array, as described elsewhere here. The frequency of phase modulation will generally be at least one order of magnitude higher than pulse frequency so that each pulse will be applied uniformly.

At 1306, the microwave pulses are directed toward the substrate to anneal an exposed surface of the substrate. Each pulse transfers momentum selectively to crystal defects and interstitials increasing the crystalline order of the surface. As the microwaves reorder the crystal, absorptivity of the microwaves diminishes because the concentration of absorbing nuclei declines. Microwave reflectivity of the surface increases, if the substrate is conductive, and microwave transmissivity and reflectivity both increase if the substrate is semiconductive.

In some embodiments, microwave reflectivity or transmissivity may be detected to monitor progress of a microwave annealing operation. A passive microwave antenna may be disposed in or near a microwave processing chamber to generate a signal representing intensity of reflected or transmitted microwaves. A controller may use the signal to determine an end point of an annealing operation.

Substrate temperature may also be monitored to detect temperature rise during microwave treatment. High resistivity substrates absorb microwaves more readily, and heat faster than low resistivity substrates. As annealing proceeds and resistivity of the substrate declines, temperature rise slows or stops. Temperature monitoring may be used to detect an anneal end point, for example when temperature rise falls below a predetermined rate.

In one embodiment, a substrate may be exposed to two or more pulse trains of microwave energy, with idle durations between the trains. The idle durations may be interposed to allow heat to radiate out of the substrate and to allow relaxation of the partially annealed crystal matrix. Such relaxation may reduce the absorptivity of already annealed locations of the crystal lattice to incident radiation. A first train of between about 5 and about 500 pulses of microwave energy may be applied, followed by a first idle time of between about 1 second and about 30 seconds. A second train of between about 5 and about 500 pulses may then be applied, followed by a second idle time of between about 1 second and about 30 seconds. Any number of pulse trains may be applied to the substrate as necessary to reach an anneal end point.

The microwave energy may be applied at more than one frequency. Different microwave frequencies will couple to different types and sizes of defects and to different dopants and juxtapositions of dopants and defects, so annealing with multiple frequencies of microwaves may improve the effectiveness of the anneal. Uniformity of the radiation field may be enhanced where multiple frequencies are used by amplitude modulating the different frequencies, instead of or in addition to phase modulating each source. Amplitude modulation of the different frequencies, particularly when the amplitude modulation is at different frequencies for the different microwave energy frequencies, produces a modulating interference pattern in a manner similar to that produced by phase modulating different emitters.

Figure 14:
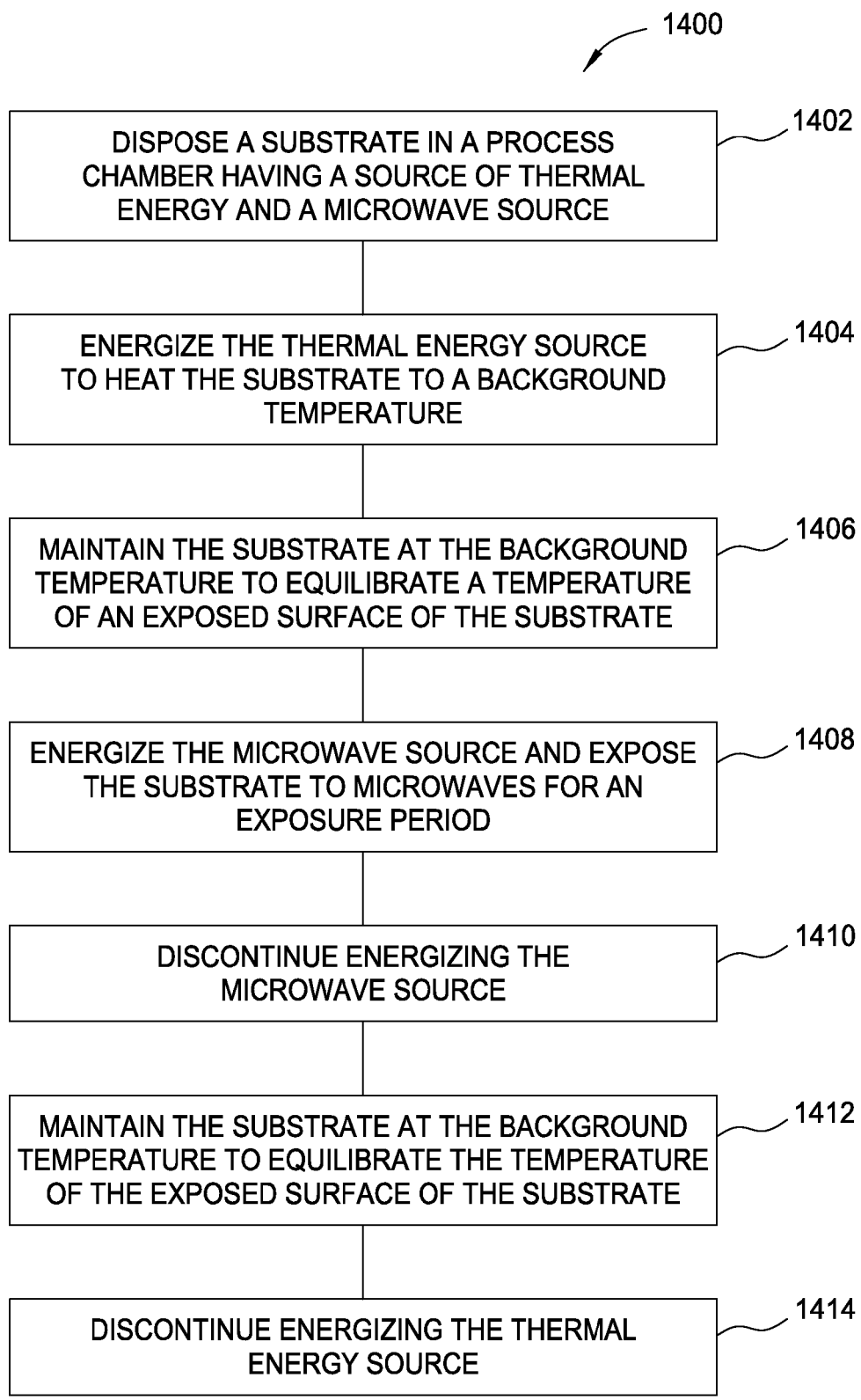
FIG. 14 is a flow diagram summarizing a method according to another embodiment.

FIG. 14 is a flow diagram summarizing a method 1400 of annealing semiconductor substrates according to another embodiment. A substrate is disposed in a chamber having a thermal energy source and a microwave energy source at 1402. At 1404, the substrate is exposed to thermal energy from the thermal energy source such as a bank of heat lamps to raise the substrate temperature to a background temperature. Depending on the type of substrate and the desired annealing operation, the background temperature may be between about 300° C. and about 1,100° C. For a silicon, or other semiconductor, substrate with logic devices formed or partially formed thereon, the method 1400 may anneal the substrate at a temperature as low as 300° C.

The substrate is allowed to equilibrate at the background temperature for a time period between about 10 seconds and about 60 seconds at 1406. At 1408, microwave radiation from the microwave energy source is provided to the chamber. The microwave energy source may be any microwave source adapted to produce a uniform energy field, such as the sources described elsewhere herein. A voltage alternating between about 25V and about 200V is applied to the microwave energy source at a frequency between about 600 MHz and about 1 THz, for example about 2.45 GHz, at a power level between about 100 W and about 10,000 W to produce microwave radiation having energy density between about 2 W/cm$^2$ and about 10 W/cm$^2$ at the substrate surface. The substrate is exposed to the microwave radiation for a time period between about 10 seconds and about 2 minutes, depending on the power applied.

The microwave energy is discontinued, and at 1410, the substrate is again allowed to equilibrate at the background temperature for a time period between about 10 seconds and about 60 seconds. The thermal energy is then discontinued at 1412, and the substrate removed from the chamber.

During the microwave treatment, microwaves penetrate the surface of the substrate to a skin depth between about 200 nm and about 100 μm, depending on the frequency of the radiation and the properties of the substrate. Power absorbed by the substrate is proportional to the resistivity of the substrate, which rises with defect and impurity density. Although shorter wavelength light, such as infrared and visible light, is absorbed by the silicon crystal matrix as thermal energy, the longer wavelength microwave radiation does not excite appreciable thermal energy in the silicon matrix. Instead, the microwaves couple directly with the defects, imparting momentum to electrons and protons in the vicinity of the defects and energizing local rearrangement to lower energy configurations. Defects are unwound and any dopant atoms or interstitials are activated into the crystal. A silicon substrate may thus be annealed at temperatures below about 500° C. by microwave energy having energy density of less than about 2 W/cm$^2$.

Figure 15:
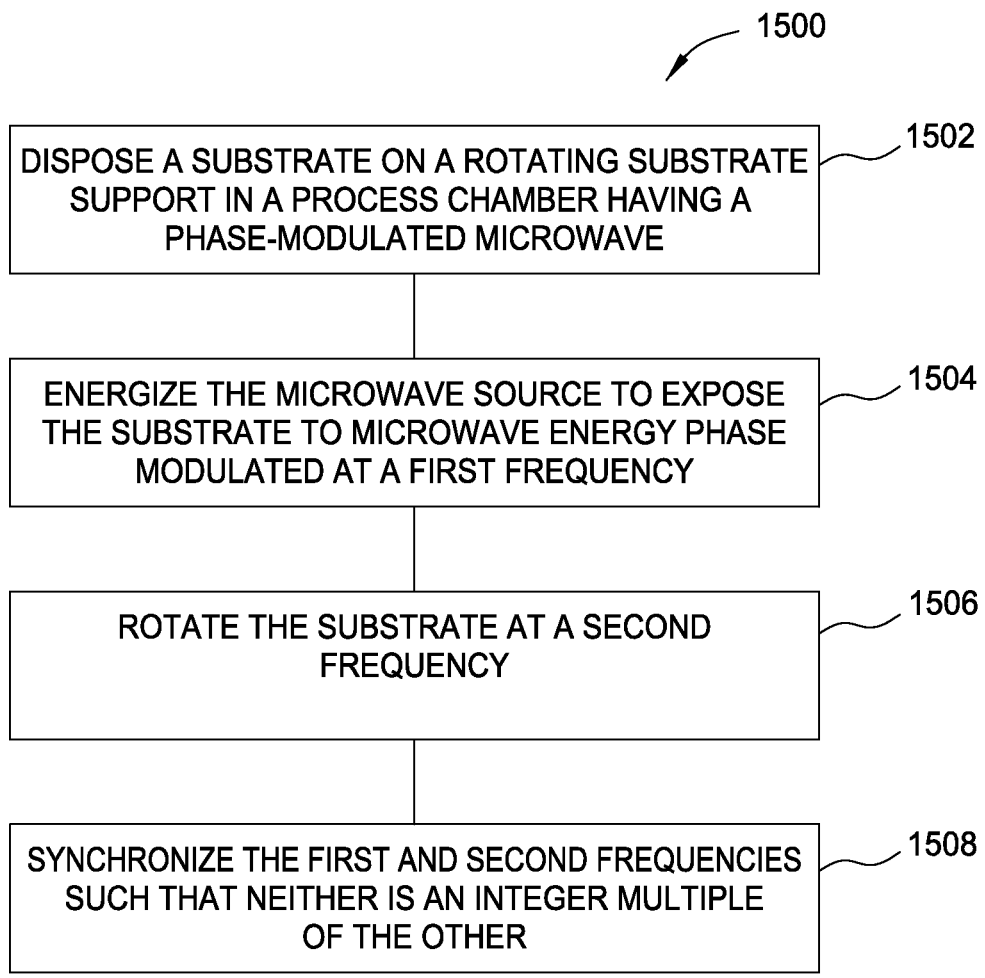
FIG. 15 is a flow diagram summarizing a method according to another embodiment.

FIG. 15 is a flow diagram summarizing a method 1500 according to another embodiment. The method 1500 may be used to treat a substrate using microwave energy to anneal, crystallize, or recrystallize a portion of the substrate. At 1502, a substrate is disposed on a rotating substrate support in a process chamber having a microwave source. The microwave source may be phase modulated to improve uniformity of the microwave radiation. At 1504, the microwave source is energized by microwave frequency power, which may be phase modulated at a first frequency (i.e. the phase of the microwave frequency power is varied at a first frequency). At 1506 the substrate is rotated at a second frequency while being exposed to the microwave energy. At 1508, the first and second frequencies are synchronized such that neither frequency is an integer multiple of the other. The first frequency, in cycles per minute, divided by the second frequency, in revolutions per minute, is not an integer, and the second frequency, in revolutions per minute, divided by the first frequency, in cycles per minute, is not an integer. Synchronization of the two frequencies avoids repetition of an interference pattern at a specific orientation of the substrate, improving the uniformity of radiation treatment.

In another embodiment, a substrate may be subjected to microwave radiation according to a designed pattern by masking the substrate with metal. Any metal may be selected for masking according to compatibility with the substrate, desired chemistry for removing the metal mask after the radiation treatment, if desired, cost, or any other consideration. The metal may be deposited according to a pattern by PVD or CVD according to any known method of forming a patterned metal layer. For a patterned microwave treatment, metal is removed from areas of the substrate desirous of exposure to microwaves, and not from areas to be protected from the microwaves. The metal mask reflects incident microwaves from the substrate in areas not to be exposed, resulting in a patterned exposure. The metal mask may then be removed, if desired.

While the foregoing is directed to embodiments of the invention, other and further embodiments of the invention may be devised without departing from the basic scope thereof.

What is claimed is:

1. A chamber for processing a semiconductor substrate, comprising:
    a thermal energy source disposed in the chamber;
    a microwave energy source disposed in the chamber, wherein the microwave energy source comprises:
        a leaky coaxial antenna, wherein the leaky coaxial antenna is curved or jointed; and
    a substrate support disposed between the thermal energy source and the microwave energy source.

2. A chamber for processing a semiconductor substrate, comprising:
    a thermal energy source disposed in the chamber;
    a microwave energy source disposed in the chamber, wherein the microwave energy source comprises:
    a leaky coaxial antenna;
    a second coaxial antenna that is a passive antenna or a leaky antenna; and
    a substrate support disposed between the thermal energy source and the microwave energy source.

3. A chamber for processing a semiconductor substrate comprising:
    a thermal energy source disposed in the chamber;
    a microwave energy source disposed in the chamber;
    a motor rotationally coupled to the microwave energy source; and
    a substrate support disposed between the thermal energy source and the microwave energy source.

4. A chamber for processing a semiconductor substrate, comprising:
    a thermal energy source disposed in the chamber;
    a microwave every source disposed in the chamber, wherein the microwave energy source comprises:
        a leaky coaxial antenna, wherein the leaky coaxial antenna comprises an inner conductor and a perforated outer conductor; and
    a substrate support disposed between the thermal energy source and the microwave energy source.

5. The chamber of claim 4, wherein the perforations are elongated slots with ends that are rectangular or rounded, and each slot has an axial dimension and a transverse dimension, and the transverse dimension is larger than the axial dimension.

6. The chamber of claim 4, wherein the perforations have an axial dimension that is less than half the wavelength of the microwave radiation produced by the leaky coaxial microwave source.

7. A microwave source for a semiconductor processing chamber, comprising:
   a conductive core having a longitudinal axis;
   a dielectric coating over the conductive core;
   an outer conductor around the dielectric coating, the outer conductor having a plurality of openings oriented along the longitudinal axis.

8. The microwave source of claim 7, further comprising a housing disposed around the outer conductor, wherein the housing is formed from a material resistant to deposition and etching.

9. A method of processing a semiconductor substrate, comprising:
   disposing the substrate on a substrate support in a chamber having a plasma-free microwave source and a thermal energy source;
   rapidly heating the substrate to a temperature of about 1,100° C. or less using the thermal energy source; and
   applying a pulse of microwave energy having power density of about 2 W/cm$^2$ or less to the substrate.

10. The method of claim 9, further comprising rotating the substrate while delivering a plurality of pulses of microwave energy.

11. The method of claim 10, wherein the applying the pulse of microwave energy is performed over a time of about 1 msec or less.

12. A method of processing a semiconductor substrate, comprising:
    disposing the substrate on a substrate support in a chamber having a leaky coaxial microwave source disposed in the chamber;
    generating standing wave microwave energy by powering a magnetron coupled to the leaky coaxial microwave source; and
    varying the standing wave microwave energy by varying a characteristic of the leaky coaxial microwave source, the magnetron, or the chamber.

13. The method of claim 12, wherein the magnetron frequency is varied by coupling a waveform generator to the magnetron.

14. The method of claim 12, wherein the microwave energy has average power density less than about 2 W/cm$^2$ and peak intensity variation less than about 5%.

15. The method of claim 14, wherein the leaky coaxial microwave source is a linear source, and the substrate and the linear source move respectively to translate the microwave energy across the substrate in a direction transverse to the longitudinal direction of the linear source.

16. The method of claim 12, wherein the varying a characteristic of the leaky coaxial microwave source or the magnetron comprises varying the magnetron frequency or phase.

17. A method of processing a semiconductor substrate, further comprising:
    disposing the substrate in a processing chamber;
    exposing the substrate to pulsed microwave radiation from a plurality of microwave radiation sources disposed in a planar arrangement in the processing chamber;
    rotating the substrate; and
    phase modulating the microwave radiation at a frequency that is not an integer multiple of the substrate rotation frequency.

18. The method of claim 17, further comprising pulsing the microwave energy at a frequency that is not an integer multiple of either the substrate rotation frequency or the phase modulation frequency.

* * * * *

UNITED STATES PATENT AND TRADEMARK OFFICE
CERTIFICATE OF CORRECTION

PATENT NO. : 9,018,110 B2
APPLICATION NO. : 14/112012
DATED : April 28, 2015
INVENTOR(S) : Stowell et al.

It is certified that error appears in the above-identified patent and that said Letters Patent is hereby corrected as shown below:

Specification

Column 14, Line 60, please delete "NB" and insert --A/B-- therefor;

Column 14, Line 66, please delete "NB" and insert --A/B-- therefor.

Signed and Sealed this
Twentieth Day of October, 2015

Michelle K. Lee
*Director of the United States Patent and Trademark Office*